(12) United States Patent
Yamamoto

(10) Patent No.: US 12,034,405 B2
(45) Date of Patent: Jul. 9, 2024

(54) CIRCUIT DEVICE AND OSCILLATOR

(71) Applicant: Seiko Epson Corporation, Tokyo (JP)

(72) Inventor: Takehiro Yamamoto, Matsumoto (JP)

(73) Assignee: SEIKO EPSON CORPORATION (JP)

( * ) Notice: Subject to any disclaimer, the term of this patent is extended or adjusted under 35 U.S.C. 154(b) by 104 days.

(21) Appl. No.: 17/562,065

(22) Filed: Dec. 27, 2021

(65) Prior Publication Data

US 2022/0209716 A1   Jun. 30, 2022

(30) Foreign Application Priority Data

Dec. 28, 2020   (JP) ................................. 2020-218552

(51) Int. Cl.
| | | |
|---|---|---|
| *H03B 28/00* | (2006.01) | |
| *G06F 1/02* | (2006.01) | |
| *H03H 9/19* | (2006.01) | |

(52) U.S. Cl.
CPC ............. *H03B 28/00* (2013.01); *G06F 1/022* (2013.01); *H03H 9/19* (2013.01); *H03B 2200/0034* (2013.01)

(58) Field of Classification Search
None
See application file for complete search history.

(56) References Cited

U.S. PATENT DOCUMENTS

| | | | | |
|---|---|---|---|---|
| 5,444,639 A * | 8/1995 | White | ................ | G01C 19/5607 |
| | | | | 73/504.03 |
| 6,927,641 B2 * | 8/2005 | Terasawa | ............. | H03K 3/0307 |
| | | | | 331/116 R |
| 6,943,636 B2 * | 9/2005 | Moore | ................ | H03B 5/1253 |
| | | | | 331/182 |
| 9,847,756 B1 | 12/2017 | Wang | | |
| 10,613,234 B2 * | 4/2020 | Nakajima | ............. | G01S 19/235 |
| 2003/0098749 A1 | 5/2003 | Terasawa et al. | | |
| 2011/0285444 A1 * | 11/2011 | Uemura | ............. | G01C 19/5614 |
| | | | | 327/299 |
| 2015/0102860 A1 * | 4/2015 | Toriumi | ................ | H03L 7/104 |
| | | | | 331/34 |
| 2015/0180413 A1 | 6/2015 | Itasaka | | |

(Continued)

FOREIGN PATENT DOCUMENTS

| | | |
|---|---|---|
| JP | 2003-224421 A | 8/2003 |
| JP | 2003-338710 A | 11/2003 |

(Continued)

*Primary Examiner* — Thomas J. Hiltunen
*Assistant Examiner* — Khareem E Almo
(74) *Attorney, Agent, or Firm* — Harness, Dickey & Pierce, P.L.C.

(57) ABSTRACT

A circuit device includes an oscillation circuit which is electrically coupled to a first node to electrically be coupled to one end of a resonator and a second node to electrically be coupled to another end of the resonator, and is configured to oscillate the resonator to generate an oscillation signal, and a waveform shaping circuit which is coupled to the first node, to which the oscillation signal is input from the first node, and which is configured to output a clock signal obtained by performing waveform shaping on the oscillation signal, and a duty adjustment circuit configured to supply the first node with a bias voltage which is variably adjusted based on adjustment data to thereby adjust a duty ratio of the clock signal.

11 Claims, 11 Drawing Sheets

(56) References Cited

U.S. PATENT DOCUMENTS

| | | | | |
|---|---|---|---|---|
| 2017/0194907 A1* | 7/2017 | Yonezawa | ............... | H03B 5/368 |
| 2018/0091156 A1* | 3/2018 | Maki | ........................ | H03L 7/085 |
| 2018/0115291 A1 | 4/2018 | Mizokami | | |
| 2022/0352850 A1* | 11/2022 | Beppu | .................... | H03B 5/364 |

FOREIGN PATENT DOCUMENTS

| JP | 2008-035302 A | 2/2008 |
|---|---|---|
| JP | 2015-126280 A | 7/2015 |
| JP | 2018-046460 A | 3/2018 |
| JP | 2018-067830 A | 4/2018 |

\* cited by examiner

CIRCUIT DEVICE AND OSCILLATOR

The present application is based on, and claims priority from JP Application Serial Number 2020-218552, filed Dec. 28, 2020, the disclosure of which is hereby incorporated by reference herein in its entirety.

BACKGROUND

1. Technical Field

The present disclosure relates to a circuit device, an oscillator, and so on.

2. Related Art

In the past, there has been known a circuit device having an oscillation circuit for oscillating a resonator such as a quartz crystal resonator. In such a circuit device, it is desired to make a duty ratio of a clock signal generated based on an oscillation signal high in accuracy. For example, in JP-A-2008-35302 (Document 1), a bias circuit which outputs a bias voltage about a half of a power supply voltage is provided to an input terminal of an output circuit, and thus, there is realized an oscillation circuit which is capable of reducing a distortion of a waveform at a high voltage side or a low voltage side of an amplitude with a high margin to make it easy to adjust the duty ratio of an output waveform to 50%.

However, in an oscillation circuit in Document 1, it is unachievable to adjust the duty ratio of a clock signal with high accuracy when a nonlinear distortion occurs in the waveform itself of the signal input to the output circuit.

SUMMARY

An aspect of the present disclosure relates to a circuit device including an oscillation circuit which is electrically coupled to a first node to electrically be coupled to one end of a resonator and a second node to electrically be coupled to another end of the resonator, and is configured to oscillate the resonator to generate an oscillation signal, a waveform shaping circuit which is coupled to the first node, to which the oscillation signal is input from the first node, and which is configured to output a clock signal obtained by performing waveform shaping on the oscillation signal, and a duty adjustment circuit configured to supply the first node with a bias voltage which is variably adjusted based on adjustment data to thereby adjust a duty ratio of the clock signal.

Further, another aspect of the present disclosure relates to an oscillator including the circuit devices described above, and the resonator.

DESCRIPTION OF AN EXEMPLARY EMBODIMENT

The present embodiment will hereinafter be described. It should be noted that the present embodiment described below does not unreasonably limit the contents set forth in the appended claims. Further, all of the constituents described in the present embodiment are not necessarily essential elements.

1. Circuit Device

Figure 1:
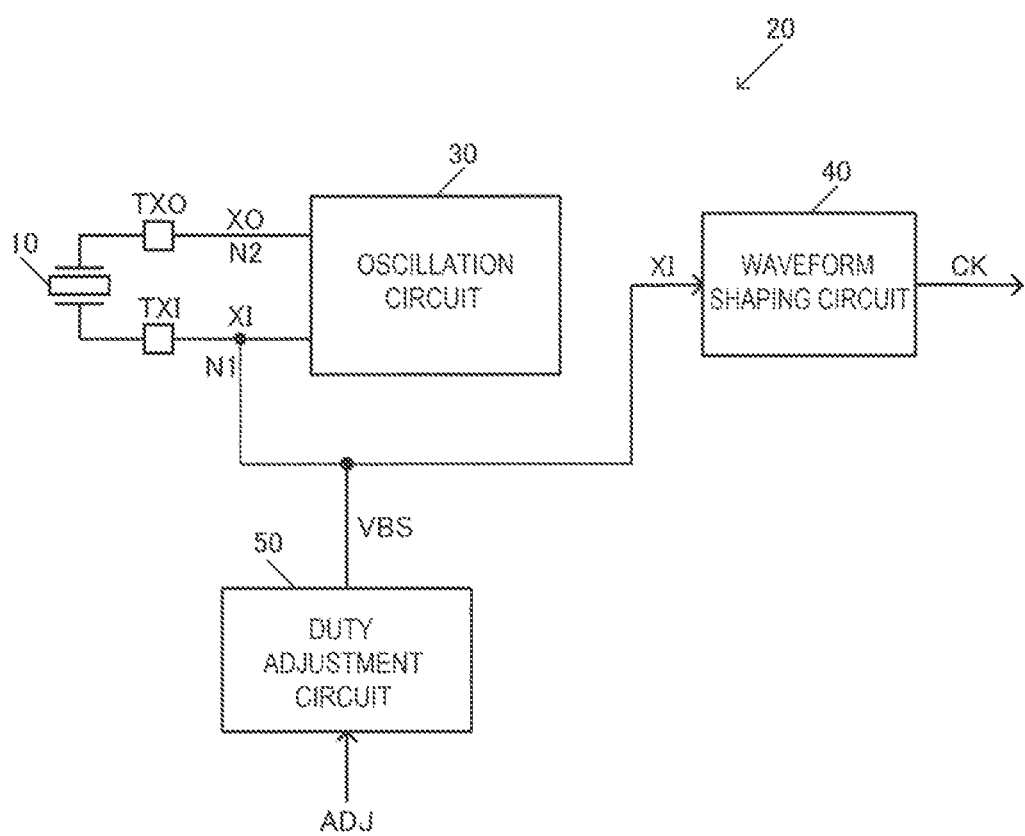
FIG. 1 is a diagram showing a configuration example of a circuit device according to an embodiment.

FIG. 1 shows a configuration example of a circuit device 20 according to the present embodiment. The circuit device 20 according to the present embodiment includes an oscillation circuit 30, a waveform shaping circuit 40, and a duty adjustment circuit 50. Further, as described with reference to FIG. 13 described later, an oscillator 4 according to the present embodiment includes a resonator 10 and the circuit device 20. The resonator 10 is electrically coupled to the circuit device 20. The resonator 10 and the circuit device 20 are electrically coupled to each other using, for example, internal interconnections of a package for housing the resonator 10 and the circuit device 20, bonding wires, or metal bumps.

The resonator 10 is an element for generating a mechanical vibration due to an electrical signal. The resonator 10 can be realized by a resonator element such as a quartz crystal resonator element. The resonator 10 can be realized by, for example, a quartz crystal resonator element which has a cutting angle of AT-cut or SC-cut, and vibrates in a thickness-shear mode, a tuning-fork quartz crystal resonator element, or a double tuning-fork quartz crystal resonator element. The resonator 10 can be, for example, a resonator incorporated in a temperature-compensated crystal oscillator (TCXO) not equipped with a constant-temperature oven, or a resonator incorporated in an oven-controlled crystal oscillator (OCXO) equipped with a constant-temperature oven. Alternatively, the resonator 10 can be a resonator incorporated in an oscillator such as an SPXO (Simple Packaged Crystal Oscillator). It should be noted that the resonator 10 according to the present embodiment can be realized by a variety of resonator elements such as a resonator element other than the thickness-shear vibration type, the tuning-fork type, or the double tuning-fork type, or a piezoelectric resonator element formed of a material other than quartz crystal. As the resonator 10, it is also possible to adopt, for example, a surface acoustic wave (SAW) resonator, or an MEMS (micro electro-mechanical systems) resonator as a silicon resonator formed using a silicon substrate.

The circuit device 20 is an integrated circuit device called an IC (Integrated Circuit). For example, the circuit device 20 is an IC manufactured using a semiconductor process, and a semiconductor chip having circuit elements formed on a semiconductor substrate.

The oscillation circuit 30 is a circuit for oscillating the resonator 10. For example, the oscillation circuit 30 is electrically coupled to a first node N1 electrically coupled to one end of the resonator 10, and a second node N2 electrically coupled to the other end of the resonator 10, and oscillates the resonator 10 to thereby generate oscillation signals XI, XO. Specifically, the oscillation circuit 30 is electrically coupled to a terminal TXI electrically coupled to the one end of the resonator 10, and a terminal TXO electrically coupled to the other end of the resonator 10, and oscillates the resonator 10 to thereby generate the oscillation signals XI, XO. The terminal TXI corresponds to a first terminal, and the terminal TXO corresponds to a second terminal. The terminals TXI, TXO are, for example, pads of the circuit device 20 as an IC. The oscillation circuit 30 can be realized by, for example, a drive circuit for oscillation disposed between the terminal TXI and the terminal TXO, and passive elements such as a capacitor and a resistor. The drive circuit can be realized by, for example, a COMS inverter circuit or a bipolar transistor. The drive circuit is a core circuit of the oscillation circuit 30, and the drive circuit performs voltage drive or current drive of the resonator 10 to thereby oscillate the resonator 10. As the oscillation circuit 30, there can be used a variety of types of oscillation circuit such as an inverter type, a Pierce type, a Colpitts type, and a Hartley type. Further, the oscillation circuit 30 is provided with a variable capacitance circuit so that the oscillation frequency can be adjusted by adjusting the capacitance of the variable capacitance circuit. The variable capacitance circuit can be realized by a variable capacitance element such as a varactor. Alternatively, it is possible to realize the variable capacitance circuit with a capacitor array having binary-weighted capacitance values and a switch array coupled to the capacitor array. The variable capacitance circuit is electrically coupled to a first signal line to which, for example, the terminal TXI is coupled. The oscillation circuit 30 can be provided with a first variable capacitance circuit to electrically be coupled to the first signal line to which the terminal TXI is coupled, and a second variable capacitance circuit to electrically be coupled to a second signal line to which the terminal TXO is coupled. It should be noted that the coupling in the present embodiment is electrical coupling. The electrical coupling means coupling capable of transmitting an electrical signal, and is coupling with which transmission of information by the electrical signal is achievable. The electrical coupling can also be coupling via a passive element or the like.

The waveform shaping circuit 40 is a circuit for performing waveform shaping of the oscillation signal XI, and is a buffer circuit to which the oscillation signal XI is input, and which outputs a clock signal CK. For example, the waveform shaping circuit 40 is coupled to the first node N1 so that the oscillation signal XI is input from the first node N1, and outputs the clock signal CK obtained by performing the waveform shaping on the oscillation signal XI. For example, the waveform shaping circuit 40 performs the waveform shaping on the oscillation signal XI as a sine wave to output the clock signal CK as a rectangular wave. The waveform shaping circuit 40 is constituted by, for example, a plurality of inverter circuits.

The duty adjustment circuit 50 is a circuit for adjusting the duty ratio of the clock signal CK. The duty adjustment circuit 50 can be said to be a bias voltage adjustment circuit for adjusting a bias voltage VBS. For example, the duty adjustment circuit 50 supplies the first node N1 with the bias voltage VBS which is variably adjusted based on adjustment data ADJ to thereby adjust the duty ratio of the clock signal CK. By the duty ratio of the clock signal CK being adjusted, a duty ratio of an output clock signal CKQ of the circuit device 20 shown in FIG. 2 described later is also adjusted as a result. The duty ratio is also called a duty cycle. It should be noted that in the present embodiment, the duty ratio is described simply as duty in some cases. The duty adjustment circuit 50 generates the bias voltage VBS having a first voltage value corresponding to a first adjustment value when, for example, the adjustment data ADJ represents the first adjustment value, and generates the bias voltage VBS having a second voltage value corresponding to a second adjustment value when the adjustment data ADJ represents the second adjustment value. In other words, the duty adjustment circuit 50 supplies the first node N1 with the bias voltage VBS the voltage value of which is variably set in accordance with the adjustment data ADJ.

By the duty adjustment circuit 50 supplying the bias voltage VBS to the first node N1 as an output node of the oscillation signal XI, the oscillation signal XI becomes an AC signal which varies centering on the bias voltage VBS. For example, the oscillation signal XI becomes an AC signal with a DC component cut by a capacitor not shown, and the central voltage of the AC signal is set by the bias voltage VBS from the duty adjustment circuit 50. Further, by the oscillation signal XI in which the bias voltage VBS is set in such a manner being input to the waveform shaping circuit 40 to thereby be shaped in waveform, the clock signal CK as a rectangular wave is generated.

In this case, the adjustment data ADJ is set to the adjustment value with which the duty ratio of the clock signal CK becomes, for example, 50%. It should be noted that the duty ratio of the clock signal CK is also a duty ratio of the output clock signal CKQ. When, for example, the fluctuation of the manufacturing process of the semiconductor is typical, the adjustment data ADJ is set to the adjustment value with which the bias voltage VBS is set to a voltage about a half of a power supply voltage of the waveform shaping circuit 40. Further, the adjustment value of the adjustment data ADJ is set so that the duty ratio of the clock signal CK becomes 50% even when the process fluctuation of a P-type transistor or an N-type transistor constituting the inverter circuit provided to the waveform shaping circuit 40 is "Fast" or "Slow." In this way, it becomes possible to generate the clock signal CK adjusted to have the duty ratio of 50% even when the process fluctuation occurs.

Figure 2:
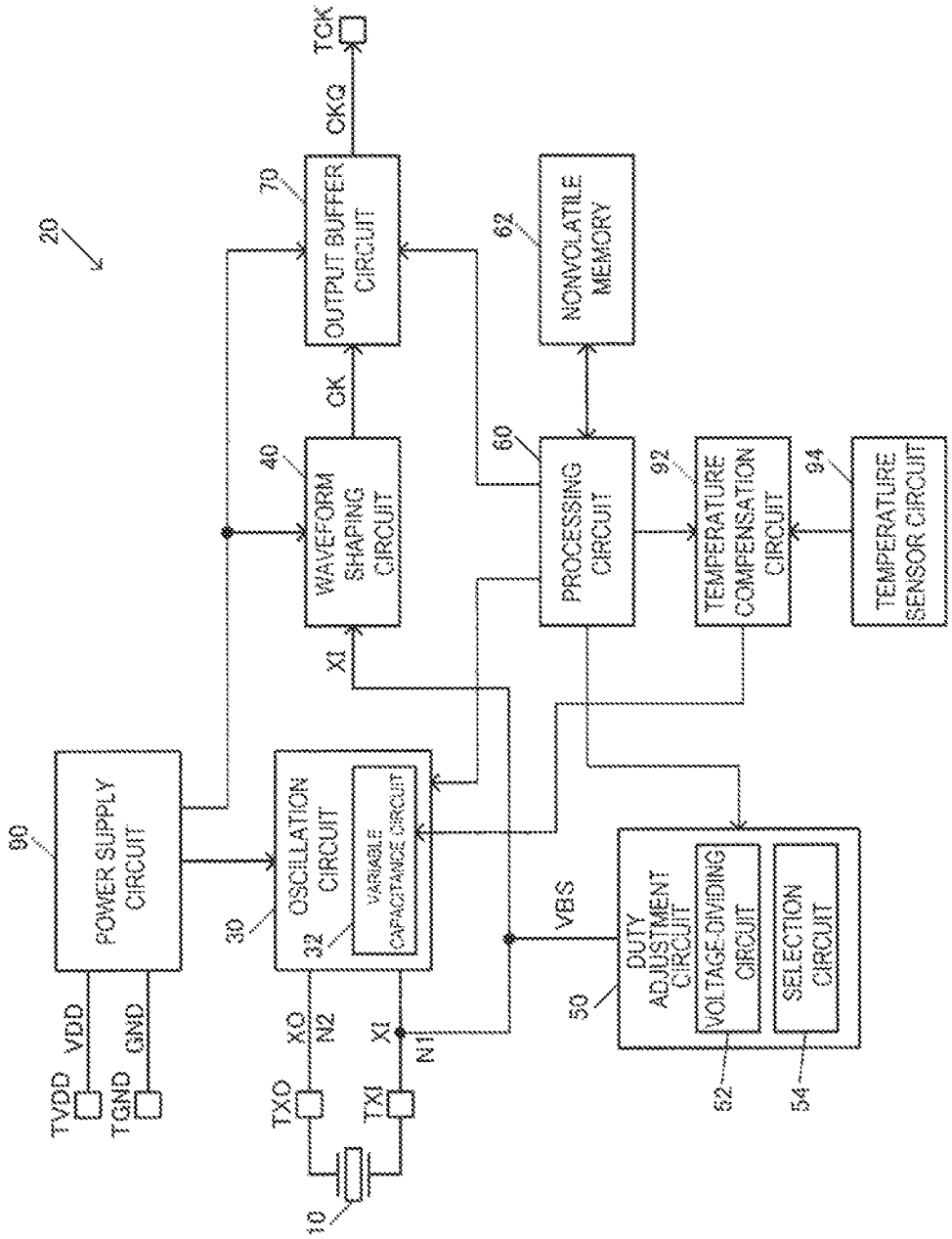
FIG. 2 is a diagram showing a detailed configuration example of the circuit device according to the embodiment.

FIG. 2 shows a detailed configuration example of the circuit device 20 according to the present embodiment. As shown in FIG. 2, the circuit device 20 can include a processing circuit 60, a nonvolatile memory 62, an output buffer circuit 70, a power supply circuit 90, a temperature compensation circuit 92, a temperature sensor circuit 94 in addition to the configuration shown in FIG. 1.

The processing circuit 60 is a control circuit for performing a variety of types of control processing, and is realized by, for example, a logic circuit. For example, the processing circuit 60 performs overall control of the circuit device 20, and performs control of an operation sequence of the circuit device 20. Further, the processing circuit 60 performs control of circuit blocks of the circuit device 20 such as the oscillation circuit 30, the output buffer circuit 70, and the temperature compensation circuit 92. Further, the processing circuit 60 performs reading control and writing control of the nonvolatile memory 62. The processing circuit can be realized by a circuit of an ASIC (Application Specific Integrated Circuit) with automatic arrangement wiring such as a gate array.

The nonvolatile memory 62 stores a variety of types of information used in the circuit device 20. The nonvolatile memory 62 can be realized by an EEPROM such as a FAMOS (Floating gate Avalanche injection MOS) memory or a MONOS (Metal-Oxide-Nitride-Oxide-Silicon) memory, but is not limited thereto, and can be an OTP (One Time Programmable) memory, a fuse-type ROM, or the like.

The nonvolatile memory 62 stores the adjustment data ADJ shown in FIG. 1. Further, the adjustment data ADJ having been retrieved from the nonvolatile memory 62 via the processing circuit 60 is input to the duty adjustment circuit 50, and the duty adjustment circuit 50 generates the bias voltage VBS which is variably set in accordance with the adjustment data ADJ, and then supplies the bias voltage VBS to the first node N1. As described above, the circuit device according to the present embodiment includes the nonvolatile memory 62 for storing the adjustment data ADJ, and the duty adjustment circuit 50 generates the bias voltage VBS as the voltage set in accordance with the adjustment data ADJ stored in the nonvolatile memory 62. It should be noted that the nonvolatile memory 62 also stores information for temperature compensation as described later.

The output buffer circuit 70 buffers the clock signal CK from the waveform shaping circuit 40, and then outputs the clock signal CK thus buffered as the output clock signal CKQ. In other words, the output buffer circuit 70 outputs the output clock signal CKQ based on the oscillation signal XI to a clock terminal TCK. Further, the output clock signal CKQ is output to the outside from the clock terminal TCK via the external terminal of the oscillator 4. For example, the output buffer circuit 70 outputs the output clock signal CKQ in a single-ended CMOS signal format. For example, when an output enable signal input via an output enable terminal not shown is in an active state, the output buffer circuit 70 outputs the output clock signal CKQ. In contrast, the output buffer circuit 70 sets the output clock signal CKQ to a stationary voltage level such as a low level when the output enable signal is in an inactive state. Thus, the voltage level of the clock terminals TCK is set to the stationary voltage level. It should be noted that when a signal is in the active state, for example, the signal is in the high level in the case of positive logic, and is in the low level in the case of negative logic. Further, when a signal is in the inactive state, for example, the signal is in the low level in the case of positive logic, and is in the high level in the case of negative logic. Further, in FIG. 2, the output buffer circuit 70 outputs the single output clock signal CKQ, but it is possible to arrange that a plurality of output clock signals is output by buffering the clock signal CK. In this case, in the plurality of output clock signals, there can be included, for example, a clock signal different in phase, specifically a clock signal different in phase as much as 180 degrees. Further, it is possible to arrange that the output buffer circuit 70 outputs the output clock signal CKQ in a signal format other than the CMOS format.

The power supply circuit 90 is supplied with a power supply voltage VDD from a power supply terminal TVDD, and is supplied with a ground voltage GND from a ground terminal GND, and thus, supplies the circuit blocks of the circuit device 20 with the power supply voltages for the individual circuit blocks. For example, the power supply circuit 90 has a regulator, and the regulator supplies regulated power supply voltages generated based on the power supply voltage VDD to the individual circuit blocks of the circuit device 20. For example, the power supply circuit 90 supplies the oscillation circuit 30 with a first regulated power supply voltage, and supplies the waveform shaping circuit 40 and the output buffer circuit 70 with a second regulated power supply voltage different from the first regulated power supply voltage. Further, the power supply circuit 90 also supplies a variety of regulated power supply voltages to the duty adjustment circuit 50, the processing circuit 60, the nonvolatile memory 62, the temperature compensation circuit 92, and the temperature sensor circuit 94. Further, the power supply circuit 90 also has a reference voltage generation circuit and a reference current generation circuit.

The temperature compensation circuit 92 performs the temperature compensation of the oscillation frequency of the oscillation circuit 30. The temperature compensation of the oscillation frequency corresponds to the temperature compensation of the oscillation signals XI, XO of the oscillation circuit 30. Specifically, the temperature compensation circuit 92 performs the temperature compensation based on temperature detection information from the temperature sensor circuit 94. For example, the temperature compensation circuit 92 generates the temperature compensation voltage based on the temperature detection voltage from the temperature sensor circuit 94, and then outputs the temperature compensation voltage thus generated to the oscillation circuit 30 to thereby perform the temperature compensation of the oscillation frequency of the oscillation circuit 30. For example, the temperature compensation circuit outputs the temperature compensation voltage to be a capacitance control voltage of a variable capacitance circuit to the variable capacitance circuit 32 provided to the oscillation circuit 30 to adjust the capacitance of the variable capacitance circuit 32 to thereby perform the temperature compensation. In this case, the variable capacitance circuit 32 of the oscillation circuit 30 is realized by a variable capacitance element such as a varactor. The temperature compensation is processing of suppressing the fluctuation of the oscillation frequency due to the temperature fluctuation to thereby compensate the oscillation frequency. For example, the temperature compensation circuit 92 performs analog temperature compensation due to polynomial approximation. For example, when the temperature compensation voltage for compensating the frequency-temperature characteristic of the resonator 10 is approximated by a polynomial, the temperature compensation circuit 92 performs the analog temperature compensation based on coefficient information of the polynomial. The analog temperature compensation is the temperature compensation realized by, for example, an add processing of a current signal or a voltage signal as an analog signal. Specifically, the nonvolatile memory 62 stores the coefficient information of the polynomial for the temperature compensation, and the processing circuit 60 retrieves the coefficient information from the nonvolatile memory 62, and then sets the coefficient information to, for example, a register of the temperature compensation circuit 92. Then, the temperature compensation circuit 92 performs the analog temperature compensation based on the coefficient information set to the register. It should be noted that it is also possible to arrange that the temperature compensation circuit 92 performs digital temperature compensation. In this case, the temperature compensation circuit 92 performs a digital temperature compensation process based on temperature detection data as the temperature detection information of the temperature sensor circuit 94. For example, the temperature compensation circuit 92 obtains frequency adjustment data based on the temperature detection data. Further, by the capacitance of the variable capacitance circuit 32 of the oscillation circuit 30 being adjusted based on the frequency adjustment data thus obtained, the temperature compensation process of the oscillation frequency of the oscillation circuit 30 is realized. In this case, the variable capacitance circuit of the oscillation circuit 30 is realized by the capacitor array having a plurality of binary-weighted capacitors, and the switch array. Further, the nonvolatile memory 62 stores a look-up table representing a correspondence between the temperature detection data and the frequency adjustment data, and the temperature compensation circuit 92 performs the temperature compensation process for obtaining the frequency adjustment data from the temperature detection data using the look-up table retrieved from the nonvolatile memory 62 by the processing circuit 60.

The temperature sensor circuit 94 is a sensor circuit for detecting the temperature. Specifically, the temperature sensor circuit 94 outputs a temperature-dependent voltage which varies in accordance with the environmental temperature as a temperature detection voltage. For example, the temperature sensor circuit 94 generates the temperature detection voltage using a circuit element having the temperature dependency. Specifically, the temperature sensor circuit 94 uses the temperature dependency provided to the forward voltage of a PN junction to thereby output the temperature detection voltage having a voltage value changing dependently on the temperature. As the forward voltage of the PN junction, there can be used, for example, a base-emitter voltage of a bipolar transistor. It should be noted that when performing the digital temperature compensation process, the temperature sensor circuit 94 measures the temperature such as the environmental temperature, and then outputs the result as the temperature detection data. The temperature detection data is, for example, data monotonically increasing or monotonically decreasing with respect to the temperature.

Further, the duty adjustment circuit 50 includes a voltage-dividing circuit 52 and a selection circuit 54. The voltage-dividing circuit 52 performs voltage division of the power supply voltage and the ground voltage to thereby output a plurality of divisional voltages. For example, the voltage-dividing circuit 52 has a plurality of resistors coupled in series between a power supply node and a ground node, and outputs the plurality of divisional voltages divided in voltage by the plurality of resistors. In other words, the voltage-dividing circuit 52 is realized by a resistor ladder circuit or the like. The power supply node is a node supplied with the power supply voltage, and the ground node is a node supplied with the ground voltage. Further, the selection circuit 54 selects a first divisional voltage which is one of the divisional voltages as the bias voltage VBS. In other words, the selection circuit 54 selects the first divisional voltage out of the divisional voltages as the bias voltage VBS based on the adjustment data ADJ. Further, the selection circuit 54 selects a second divisional voltage which is one of the divisional voltages as a reference voltage VREF described later.

Figure 3:
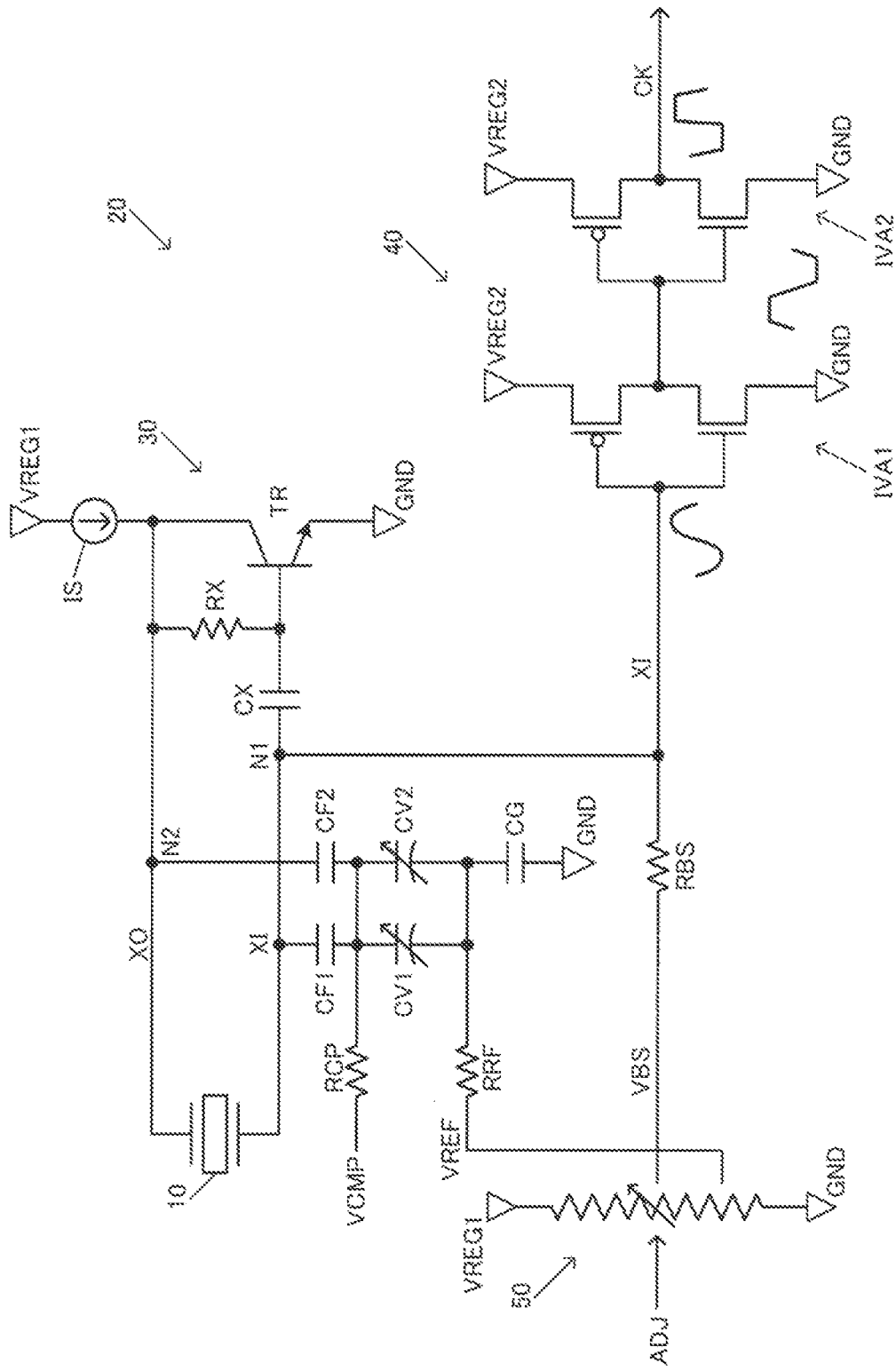
FIG. 3 is a diagram showing a further detailed configuration example of the circuit device according to the embodiment.

FIG. 3 shows a further detailed configuration example of the circuit device 20. In FIG. 3, the oscillation circuit 30 includes a current source IS, a bipolar transistor TR, a resistor RX, and a capacitor CX. The current source IS and the bipolar transistor TR are disposed in series between a power supply node at VREG1 and the ground node. The current source IS and the bipolar transistor TR constitute the drive circuit of the oscillation circuit 30. The current source IS can be realized by, for example, a CMOS transistor the gate of which is provided with the bias voltage. The resistor RX is disposed between a collector node and a base node of the bipolar transistor TR. The capacitor CX is disposed between the base node of the bipolar transistor TR and the first node N1.

Further, in FIG. 3, as the variable capacitance circuit 32 shown in FIG. 2, the oscillation circuit 30 includes variable capacitance elements CV1, CV2 realized by varactors or the like, and capacitors CF1, CF2 each having a stationary capacitance in which the capacitance values are fixed. Specifically, the oscillation circuit 30 includes the capacitor CF1 having a stationary capacitance and having one end to be coupled to the first node N1, and the variable capacitance element CV1 one end of which is coupled to the other end of the capacitor CF1 having the stationary capacitance, and which is variable in capacitance value. Further, the oscillation circuit 30 includes the capacitor CF2 having a stationary capacitance and having one end to be coupled to the second node N2, and the variable capacitance element CV2 one end of which is coupled to the other end of the capacitor CF2 having the stationary capacitance, and which is variable in capacitance value. Between the other ends of the variable capacitance elements CV1, CV2 and the ground node, there is disposed a capacitor CG. Further, a temperature compensation voltage VCMP from the temperature compensation circuit 92 shown in FIG. 2 is supplied to the one ends of the variable capacitance elements CV1, CV2 via a resistor RCP. Further, a reference voltage VREF is supplied to the other ends of the variable capacitance elements CV1, CV2 via a resistor RRF. In this way, a voltage corresponding to a voltage difference between the temperature compensation voltage VCMP and the reference voltage VREF is applied to the variable capacitance elements CV1, CV2. Thus, the variable capacitance elements CV1, CV2 are set to a capacitance corresponding to the temperature compensation voltage VCMP, and the temperature compensation of the oscillation frequency of the oscillation circuit 30 is realized. It should be noted that in FIG. 3, the duty adjustment circuit 50 for supplying the bias voltage VBS also supplies the reference voltage VREF.

The duty adjustment circuit 50 is realized by a ladder resistance circuit disposed between the power supply node of the power supply voltage VREG1 and the ground node, and outputs the bias voltage VBS as the divisional voltage by the ladder resistance circuit. Further, the duty adjustment circuit 50 outputs the reference voltage VREF for the temperature compensation as described above. Further, the bias voltage VBS is supplied to the first node Ni via a resistor RBS. By the bias voltage VBS, a central voltage of the oscillation signal XI as the AC signal is set, and the oscillation signal XI as, for example, a sine wave which varies centering around the bias voltage VBS becomes to be input to the waveform shaping circuit 40.

The waveform shaping circuit 40 includes a plurality of inverter circuits IVA1, IVA2 which forms a buffer circuit. The inverter circuits IVA1, IVA2 are each constituted by a P-type transistor and an N-type transistor disposed in series between a power supply node at VREG2 and the ground node. Further, the oscillation signal XI the bias point of which is set by the bias voltage VBS is input to the inverter circuit IVA1 which is a first stage inverter circuit of the waveform shaping circuit 40 as an input signal. In other words, the oscillation signal XI is input to the gates of the P-type transistor and the N-type transistor constituting the inverter circuit IVA1. Further, an output signal of the inverter circuit IVA1 is input to the inverter circuit IVA2 which is a next stage inverter circuit, and the inverter circuit IVA2 outputs the clock signal CK. Thus, the clock signal CK as a rectangular wave obtained by performing waveform shaping on the oscillation signal XI becomes to be output from the waveform shaping circuit 40. It should be noted that as an example, the temperature compensation voltage VCMP is a voltage which varies centering around the voltage of, for example, 0.9 V in accordance with the temperature detection result. The reference voltage VREF is a voltage of, for example, around 0.3 V through 0.4 V. The power supply voltage VREG1 is, for example, 1.2 V, and the power supply voltage VREG2 is, for example, 1.0 V. The bias voltage VBS is a voltage which is adjusted in a range of, for example, ±0.1 V centering on 0.5 V as a voltage about a half of the power supply voltage VREG2 of, for example, the waveform shaping circuit 40.

As described above, the circuit device 20 according to the present embodiment includes the oscillation circuit 30, the waveform shaping circuit 40, and the duty adjustment circuit 50, wherein the oscillation circuit 30 is coupled to the first node N1 and the second node N2 both coupled to the resonator 10, and generates the oscillation signals XI, XO, the oscillation signal XI is input to the waveform shaping circuit 40 from the first node N1, the waveform shaping circuit 40 outputs the clock signal CK, and the duty adjustment circuit 50 supplies the first node Ni with the bias voltage VBS which is variably adjusted based on the adjustment data ADJ. Further, by the oscillation signal X1 which varies centering on the bias voltage VBS variably adjusted by the adjustment data ADJ being input to the waveform shaping circuit 40 to be shaped in waveform, the duty ratio of the clock signal CK becomes to be adjusted. In this way, it becomes possible to adjust the duty ratio of the clock signal CK taking the process fluctuation of the threshold voltage or the like of the P-type transistor and the N-type transistor constituting the waveform shaping circuit 40, a degree of the distortion of the oscillation waveform, and a shift of the duty ratio in the posterior stage circuit into consideration, and it becomes possible to adjust the duty ratio of the output clock signal CKQ from the circuit device 20.

Thus, it becomes possible to approximate the duty ratio to, for example, 50%, and it becomes possible to realize the high-accuracy duty adjustment.

Figure 4:
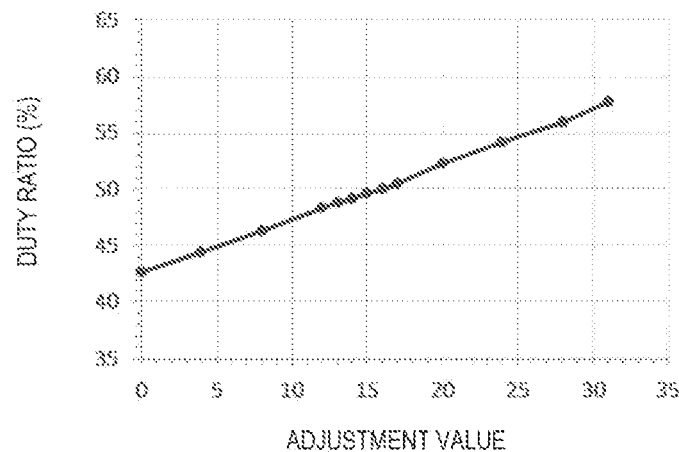
FIG. 4 is a graph showing a relationship between an adjustment value of adjustment data and a duty ratio.

For example, FIG. 4 is a graph showing a relationship between the adjustment value of the adjustment data ADJ and the duty ratio.

In FIG. 4, there is performed the duty adjustment in which 50%±8% is sliced into, for example, 32 steps with the adjustment data ADJ in, for example, 5 bits, and there is performed the duty adjustment with the resolution of 0.4%.

Figure 5:
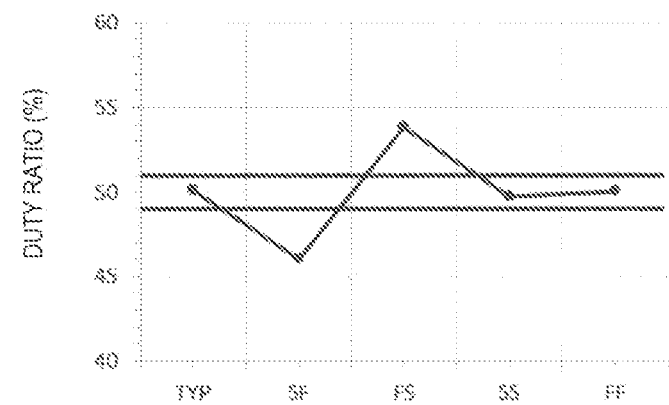
FIG. 5 is a graph showing a process fluctuation of a duty ratio of a clock signal.

FIG. 5 is a graph showing a corner simulation result of the process fluctuation of the duty ratio when the duty adjustment by the duty adjustment circuit 50 has not been performed. Here, TYP means a typical case. SF means a case in which the N-type transistor is Slow, and the P-type transistor is Fast, and FS means a case in which the N-type transistor is Fast, and the P-type transistor is Slow. SS means a case in which the N-type transistor and the P-type transistor are both Slow, and FF means a case in which the N-type transistor and the P-type transistor are both Fast. As shown in FIG. 5, due to the fluctuation of the manufacturing process of the semiconductor, the duty ratio fluctuates in a range of about 50%+5%.

Figure 6:
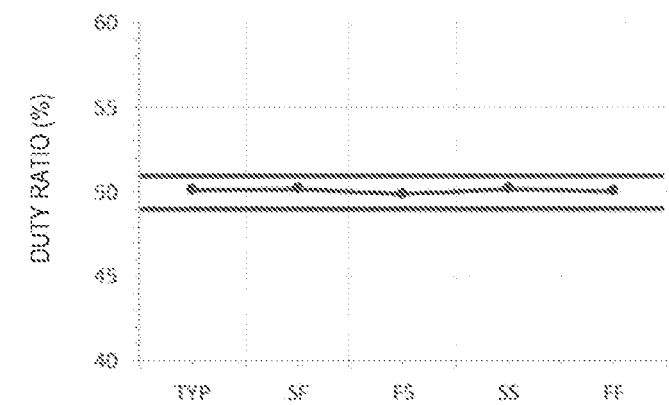
FIG. 6 is a graph showing a process fluctuation of a duty ratio when performing a duty adjustment of a duty adjustment circuit.

In contrast, FIG. 6 is a graph showing a corner simulation result of the process fluctuation of the duty ratio when the duty adjustment by the duty adjustment circuit 50 has been performed. As shown in FIG. 6, by the duty adjustment circuit 50 supplying the bias voltage VBS variably set based on the adjustment data ADJ, it becomes possible to realize such a high-accuracy duty adjustment as to make, for example, the fluctuation of the duty ratio become within a range of 50%+1%.

Figure 7:
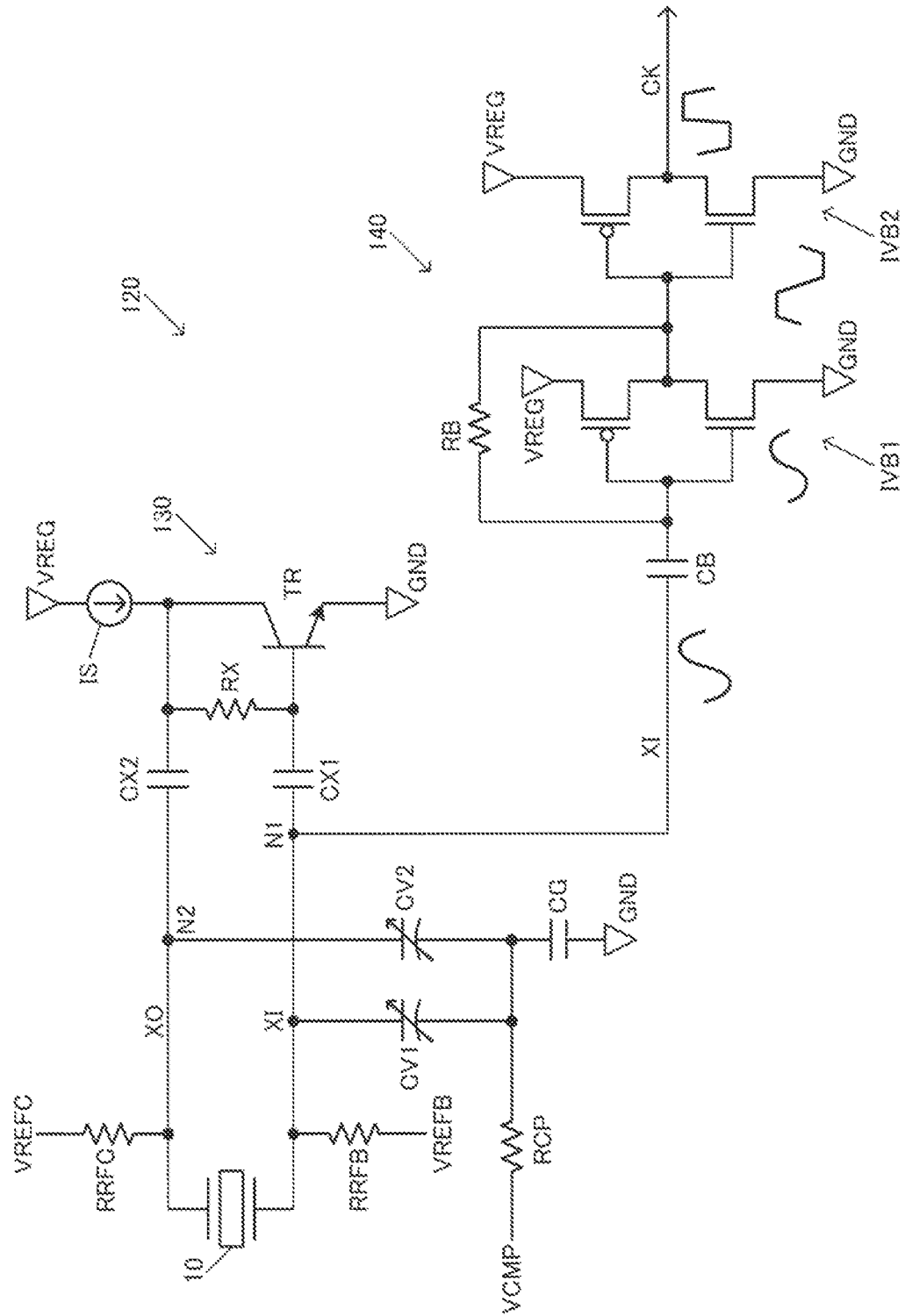
FIG. 7 is a diagram showing a configuration example of a circuit device according to a first comparative example of the present embodiment.

FIG. 7 shows a circuit device 120 according to a first comparative example of the present embodiment. In an oscillation circuit 130 of the circuit device 120 according to the first comparative example, there is disposed a capacitor CX2 between the second node N2 and a collector node of the bipolar transistor TR in addition to a capacitor CX1 between the first node N1 and a base node of the bipolar transistor TR. Further, the variable capacitance element CV1 is coupled to the first node N1 in one end, and is coupled to a supply node of the temperature compensation voltage VCMP in the other end, and the variable capacitance element CV2 is coupled to the second node N2 in one end, and is coupled to the supply node of the temperature compensation voltage VCMP in the other end. Further, a reference voltage VREFB is supplied to the first node N1 as the node of the oscillation signal XI, and a reference voltage VREFC is supplied to the second node N2 as the node of the oscillation signal XO. Thus, the oscillation signal XI becomes an oscillation signal which varies centering on the reference voltage VREFB, and the oscillation signal XO becomes an oscillation signal which varies centering on the reference voltage VREFC. The reference voltage VREFB is, for example, 0.4 V, and the reference voltage VREFC is, for example, 1.2 V.

Further, in the first comparative example shown in FIG. 7, a capacitor CB for cutting the DC component is disposed between the first node N1 and an input node of a waveform shaping circuit 140. Thus, the DC component of the oscillation signal XI is cut, and the AC component becomes to be input to the waveform shaping circuit 140. Further, the waveform shaping circuit 140 includes inverter circuits IVB1, IVB2, and the inverter circuit IVB1 as the first stage inverter circuit is provided with a feedback resistor RB disposed between an output node and an input node thereof. By disposing such a feedback resistor RB, the bias point of the inverter circuit IVB1 as the first stage inverter circuit becomes to be set by the self-bias.

As described above, in the first comparative example shown in FIG. 7, the reference voltage VREFB for the temperature compensation is applied to the first node N1 as the node of the oscillation signal XI, and the oscillation signal XI becomes the oscillation signal which varies centering on the reference voltage VREFB. Here, the reference voltage VREFB is adjusted to, for example, a voltage which optimizes the sensitivity of the variable capacitance element CV1, but does not coincide with the threshold voltage of the inverter circuit IVB1 as the first stage inverter circuit of the waveform shaping circuit 140. As an example, in the first comparative example, since the inverter circuit IVB1 is supplied with the power supply voltage of VREG=1.5 V, the threshold voltage of the inverter circuit IVB1 becomes about VREG/2=0.75 V.

In contrast, since the reference voltage VREFB is adjusted to, for example, VREFB=0.4 V so that the sensitivity of the variable capacitance element CV1 is optimized, the threshold voltage of the inverter circuit IVB1 and the reference voltage VREFB to be the central voltage of the oscillation signal XI do not coincide with each other. Further, the reference voltage VREFB is adjusted in accordance with the manufacturing fluctuation of the varactor as the variable capacitance element and so on, but is not adjusted in accordance with the manufacturing fluctuation of the P-type transistor and the N-type transistor constituting the inverter circuit IVB1 and so on.

Therefore, in the first comparative example shown in FIG. 7, it is necessary to dispose the capacitor CB for cutting the DC component to the input node of the inverter circuit IVB1 to cut the DC component of the oscillation signal XI, and thus, input only the AC component of the oscillation signal XI to the inverter circuit IVB1. Further, in the inverter circuit IVB1 as the first stage inverter circuit, by coupling the output node and the input node to each other via the feedback resistor RB, the bias point is adjusted by the self-bias. However, in such an adjustment of the bias point with the self-bias, there is a problem that when a nonlinear distortion occurs in the waveform of the oscillation signal XI, the duty ratio of the clock signal CK fluctuates, and thus, it is unachievable to realize the high-accuracy duty ratio. For example, in the comparative example shown in FIG. 7, an effective value of the fluctuation of the duty ratio is about %+4%, and it is unachievable to realize such a high-accuracy duty ratio as 50%±1%. There is an application in which when an external processing device performs processing based on, for example, the output clock signal CKQ obtained by buffering the clock signal CK, the processing device performs the processing using not only the rising edge of the output clock signal CKQ but also the falling edge thereof. In such an application, since it is unachievable to perform appropriate processing with the duty ratio of about 50%±4%, such a high-accuracy duty ratio as within 50%±1% is required in some cases, but it is unachievable to meet such needs in the first comparative example shown in FIG. 7.

In this regard, in the circuit device 20 according to the present embodiment shown in FIG. 3, the capacitor CF1 for cutting the DC component is disposed between the first node N1 of the oscillation signal XI and the variable capacitance element CV1. Further, the capacitor CF2 for cutting the DC component is also disposed between the second node N2 of the oscillation signal XO and the variable capacitance element CV2. In this way, it becomes possible to set the bias voltage VBS independent of the setting of the reference voltage VREF for the temperature compensation, and it becomes possible to make the oscillation signal XI turn to an oscillation signal which varies centering on the bias voltage VBS.

For example, by adjusting the reference voltage VREF, it is possible to adjust the variable capacitance elements CV1, CV2 so as to have optimum sensitivity. In this case, the capacitance of the first node N1 becomes a series capacitance of the variable capacitance element CV1 and the capacitor CF1, and the capacitance of the second node N2 becomes a series capacitance of the variable capacitance element CV2 and the capacitor CF2. However, by making the capacitances of the capacitors CF1, CF2 sufficiently high, it becomes possible to adjust the capacitances of the first node N1 and the second node N2 to appropriate capacitances corresponding to the environmental temperature, using the variable capacitance elements CV1, CV2.

Further, in the present embodiment, it is possible to adjust the bias voltage VBS to an appropriate voltage with which the duty ratio of the clock signal CK comes closer to 50% with the duty adjustment circuit 50 using the adjustment data ADJ independently of the reference voltage VREF.

It is assumed that, for example, the threshold voltage of the inverter circuit IVA1 as the first stage inverter circuit of the waveform shaping circuit 40 shown in FIG. 3 becomes a voltage lower than the voltage a half of the power supply voltage VREG2 due to the process fluctuation of the threshold voltage and so on of the P-type transistor and the N-type transistor. When there occurs the process fluctuation in which, for example, the N-type transistor is Fast, and the P-type transistor becomes Slow, the threshold voltage of the inverter circuit IVA1 becomes the voltage lower than the voltage a half of the power supply voltage VREG2. On this occasion, when the bias voltage VBS is kept at the voltage a half of the power supply voltage VREG2, there occurs the situation in which the duty ratio of the clock signal CK becomes higher than 50% In this case, in the present embodiment, the duty adjustment circuit 50 sets the bias voltage VBS to a voltage lower than the voltage a half of the power supply voltage VREG2 based on the adjustment data ADJ. In this way, even when the threshold voltage of the inverter circuit IVA1 becomes the lower voltage due to the process fluctuation, the bias voltage VBS to be the central voltage of the oscillation signal XI lowers accordingly, and therefore, it becomes possible to make the duty ratio of the clock signal CK closer to 50%. Therefore, it is possible to realize such a high-accuracy duty adjustment that the fluctuation of the duty ratio becomes within 50%+1%.

In contrast, it is assumed that the threshold voltage of the inverter circuit IVA1 as the first stage inverter circuit of the waveform shaping circuit 40 becomes a voltage higher than the voltage a half of the power supply voltage VREG2 due to the process fluctuation of the threshold voltage and so on of the P-type transistor and the N-type transistor. When there occurs the process fluctuation in which, for example, the P-type transistor is Fast, and the N-type transistor becomes Slow, the threshold voltage of the inverter circuit IVA1 becomes the voltage higher than the voltage a half of the power supply voltage VREG2.

On this occasion, when the bias voltage VBS is kept at the voltage a half of the power supply voltage VREG2, there occurs the situation in which the duty ratio of the clock signal CK becomes lower than 50% In this case, in the present embodiment, the duty adjustment circuit 50 sets the bias voltage VBS to a voltage higher than the voltage a half of the power supply voltage VREG2 based on the adjustment data ADJ. In this way, even when the threshold voltage of the inverter circuit IVA1 becomes the higher voltage due to the process fluctuation, the bias voltage VBS to be the central voltage of the oscillation signal XI becomes higher accordingly, and therefore, it becomes possible to make the duty ratio of the clock signal CK closer to 50%. Therefore, it is possible to realize such a high-accuracy duty adjustment that the fluctuation of the duty ratio becomes within 50%±1%.

Further, in FIG. 3, since there is no need to provide the capacitor CB for cutting the DC component disposed in the first comparative example shown in FIG. 7, attenuation of the oscillation amplitude due to the voltage division by the capacitor CB for cutting the DC component and the input capacitance is suppressed, and therefore, it becomes possible to realize a decrease in noise floor. Further, since such a feedback resistor RB as shown in FIG. 7 becomes unnecessary, it becomes possible to prevent an abnormal oscillation caused by the feedback resistor RB.

Figure 8:
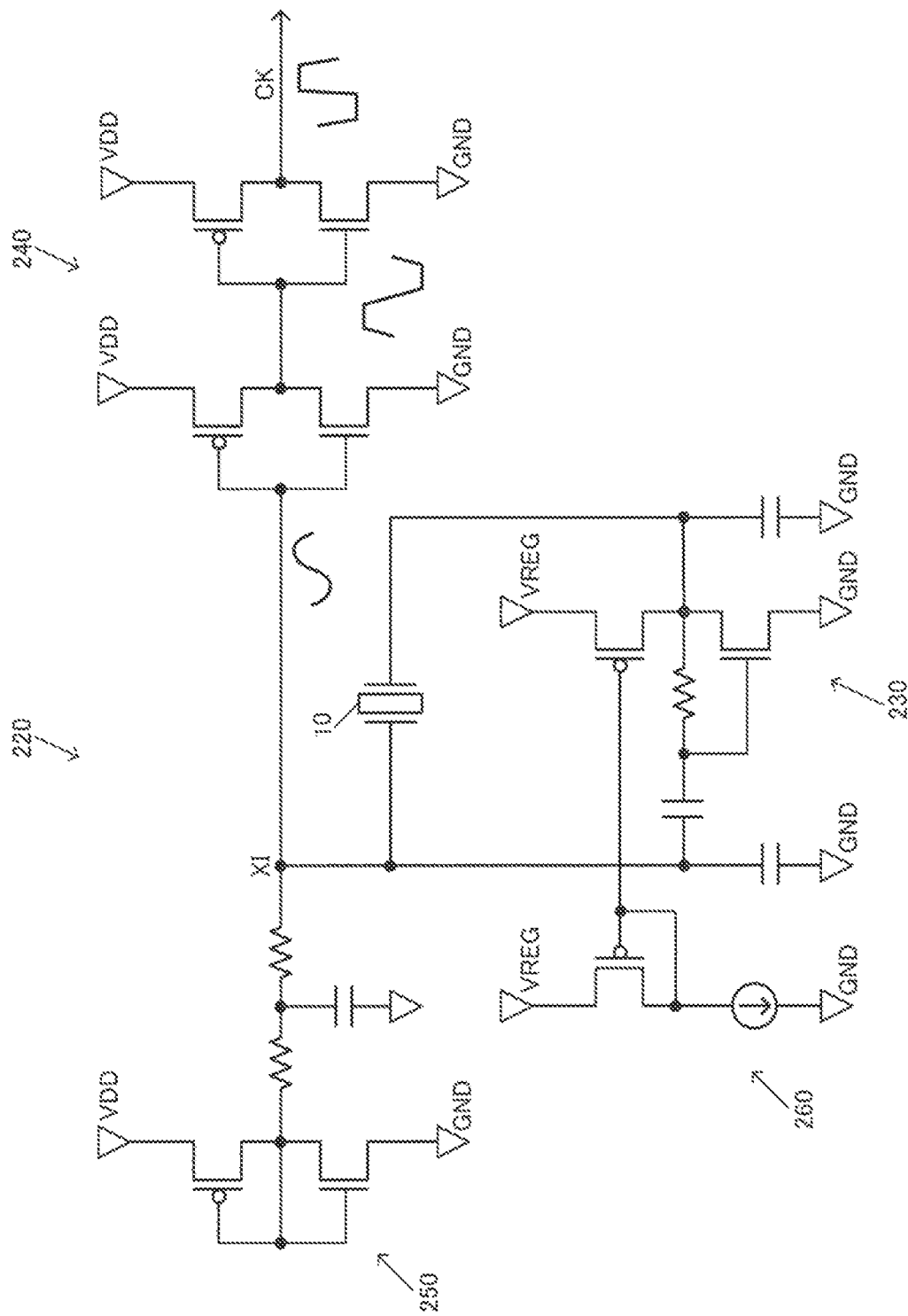
FIG. 8 is a diagram showing a configuration example of a circuit device according to a second comparative example of the present embodiment.

FIG. 8 shows a circuit device 220 according to a second comparative example of the present embodiment. The second comparative example corresponds to a circuit in Document 1 described above, and is provided with an oscillation circuit 230, a waveform shaping circuit 240, a bias circuit 250, and a constant current circuit 260. In this second comparative example, the bias circuit 250 is a replica circuit of the waveform shaping circuit 240, and the bias voltage output by the bias circuit 250 depends on the power supply voltage VDD supplied. For example, the bias circuit 250 outputs a bias voltage about a half of the power supply voltage VDD. However, the duty ratio of the clock signal CK also fluctuates due to a circuit in the posterior stage, and also fluctuates due to the distortion of the oscillation waveform in addition to the fluctuation due to the variation in a range of, for example, about ±0.1 V of the threshold voltage of the P-type transistor and the N-type transistor in the first stage inverter circuit. Therefore, in the second comparative example shown in FIG. 8, there is a problem that it is unachievable to realize the high-accuracy duty adjustment taking such a variety of fluctuation factors into consideration. Further, in the second comparative example shown in FIG. 8, the bias circuit 250 simply outputs the bias voltage about a half of the power supply voltage VDD, and an adjustment circuit for adjusting the bias voltage based on the adjustment data does not exist.

In this regard, in the circuit device 20 according to the present embodiment, it is possible to variably adjust the bias voltage VBS based on the adjustment data ADJ. In other words, there is provided the duty adjustment circuit 50 as the circuit for adjusting the bias voltage VBS based on the adjustment data ADJ. Therefore, since it is possible to adjust the bias voltage VBS to adjust the duty ratio of the clock signal CK taking the shift of the duty ratio in the circuit in the posterior stage, the degree of the distortion of the oscillation waveform, and so on into consideration in addition to, for example, the variation in the threshold voltage and so on of the P-type transistor and the N-type transistor in the inverter circuit IVA1 as the first stage inverter circuit shown in FIG. 3, it becomes possible to achieve the high-accuracy duty adjustment compared to the second comparative example shown in FIG. 8 and so on.

For example, the circuit device 20 according to the present embodiment includes the nonvolatile memory 62 for storing the adjustment data ADJ, and the duty adjustment circuit 50 generates the bias voltage VBS as the voltage set in accordance with the adjustment data ADJ stored in the nonvolatile memory 62. For example, the duty adjustment circuit 50 generates the bias voltage VBS having the first voltage value corresponding to the first adjustment value when the adjustment data ADJ stored in the nonvolatile memory 62 represents the first adjustment value, and generates the bias voltage VBS having the second voltage value corresponding to the second adjustment value when the adjustment data ADJ represents the second adjustment value. In this way, by storing the adjustment data ADJ making it possible to set the optimum duty ratio in the nonvolatile memory 62, and when the circuit device 20 operates, by the duty adjustment circuit 50 then supplying the bias voltage VBS corresponding to the adjustment data ADJ retrieved from the nonvolatile memory 62, it becomes possible to realize such a high-accuracy duty adjustment as 50%±1%. Specifically, in an inspection step in manufacturing the circuit device 20, the duty ratio of the output clock signal CKQ is measured, the adjustment data ADJ is decided based on the measurement result, and is then written into the nonvolatile memory 62. For example, the adjustment data ADJ is decided taking not only the variation in the threshold voltage and so on of the transistor due to the process fluctuation, but also the nonlinear distortion of the oscillation waveform and so on into consideration. Further, when the circuit device 20 operates, the adjustment data ADJ thus decided based on the measurement result is retrieved from the nonvolatile memory 62, and then the duty adjustment circuit 50 supplies the bias voltage VBS corresponding to the adjustment data ADJ, and thus, it becomes possible to realize such a high-accuracy duty adjustment as within 50%±1%.

Further, in the present embodiment, the power supply voltage VREG1 of the oscillation circuit 30 shown in FIG. 3 is set no lower than the power supply voltage VREG2 of the waveform shaping circuit 40. In other words, a relationship of VREG1≥VREG2 is fulfilled. As an example, the power supply voltage VREG1 is 1.2 V, and the power supply voltage VREG2 is 1 V.

In contrast, in the second comparative example shown in FIG. 8, the power supply voltage VREG of the oscillation circuit 230 is 1.2 V, the power supply voltage VDD of the waveform shaping circuit 240 and the bias circuit 250 is in a range of 1.8 through 5 V, and a relationship of VREG<VDD is fulfilled. Therefore, the amplitude voltage of the oscillation signal XI input to the waveform shaping circuit 240 is lower than the power supply voltage VDD of the waveform shaping circuit 240, and a rising waveform and a falling waveform of an output signal of the first stage inverter circuit of the waveform shaping circuit 240 fail to be steep, but becomes an obtuse waveform. Further, when the output signal of the first stage inverter circuit becomes the obtuse waveform, the duty ratio fluctuates due to a variation in the threshold voltage and so on of the P-type transistor and the N-type transistor of the next stage inverter circuit.

In contrast, in the present embodiment, the power supply voltage VREG1 of the oscillation circuit 30 is set no lower than the power supply voltage VREG2 of the waveform shaping circuit 40. Therefore, it becomes possible to make the amplitude of the oscillation signal XI to be input to the waveform shaping circuit 40 as large as possible within a drive voltage range of the waveform shaping circuit 40. In other words, it becomes possible to input the oscillation signal XI having the largest possible amplitude within the drive voltage range of the waveform shaping circuit 40 decided by the power supply voltage VREG2 to the inverter circuit IVA1 as the first stage inverter circuit of the waveform shaping circuit 40. Therefore, since the period in which both of the P-type transistor and the N-type transistor of the inverter circuit IVA1 as the first stage inverter circuit is set to an ON state almost vanishes, the rising waveform and the falling waveform of the output signal of the inverter circuit IVA1 become steep. As a result, it becomes possible to decrease the fluctuation of the duty ratio caused by the variation in the threshold voltage and so on of the P-type transistor and the N-type transistor of the inverter circuit IVA2 as the next stage inverter circuit. Further, an AM noise caused by the fluctuation of the amplitude of the oscillation signal XI is converted into a PM noise as a phase noise due to the waveform shaping by the waveform shaping circuit 40. In this regard, by making the relationship of VREG1≥VREG2 be fulfilled, and making the amplitude of the oscillation signal XI as large as possible within the drive voltage range of the waveform shaping circuit 40 as in the present embodiment, it is possible to decrease the degree of the conversion of the AM noise into the PM noise to improve the signal quality of the clock signal CK. Further, the waveform shaping circuit 40 and the output buffer circuit 70 in the posterior stage operate with the same power supply voltage VREG2, and by making the power supply voltage VREG2 lower than the power supply voltage VREG1 of the oscillation circuit 30, it is possible to reduce the power consumption in the output buffer circuit 70. For example, the output buffer circuit 70 drives a heavy load in the outside, and is therefore higher in power consumption compared to other circuit blocks, but by setting the power supply voltage VREG2 to a voltage lower than the power supply voltage VREG1, it becomes possible to reduce the power consumption accordingly.

Further, as shown in FIG. 3, in the present embodiment, the oscillation circuit 30 includes the capacitor CF1 having a stationary capacitance the capacitance value of which is fixed, and coupled to the first node N1 in one end, and the variable capacitance element CV1 one end of which is coupled to the other end of the capacitor CF1 having the stationary capacitance, and which is variable in capacitance value. Further, the temperature compensation voltage VCMP is input to one of the one end and the other end of the variable capacitance element CV1, and the reference voltage VREF is input to the other of the one end and the other end thereof. For example, in FIG. 3, the temperature compensation voltage VCMP is input to the one end of the variable capacitance element CV1, and the reference voltage VREF is input to the other end of the variable capacitance element CV1. It should be noted that it is possible to input the temperature compensation voltage VCMP to the other end of the variable capacitance element CV1 as the ground node side, and input the reference voltage VREF to the one end of the variable capacitance element CV1 as the capacitor CF1 side. Further, the variable capacitance element CV2 is also provided with substantially the same coupling configuration as that of the variable capacitance element CV1, but the detailed description will be omitted here.

According to such a configuration, it becomes possible to apply the voltage corresponding to the voltage difference between the temperature compensation voltage VCMP and the reference voltage VREF to the variable capacitance element CV1, and it becomes possible to change the capacitance value of the variable capacitance element CV1 using the temperature compensation voltage VCMP based on the reference voltage VREF to realize the temperature compensation of the oscillation frequency of the oscillation circuit 30. Further, by disposing the capacitor CF1 having the stationary capacitance, it becomes possible to adjust the bias voltage VBS and the reference voltage VREF independently of each other. In other words, it becomes possible to independently adjust the reference voltage VREF of the variable capacitance element CV1 such as a varactor at the same time as the duty adjustment by changing the bias voltage VBS. It becomes possible to adjust the reference voltage VREF so that a potential difference between both ends of the variable capacitance element CV1 becomes larger than 0 V, and at the same time, the sensitivity becomes optimum while performing the duty adjustment of changing the bias voltage VBS so that, for example, the duty ratio of the clock signal CK comes closer to 50%.

Further, in the present embodiment, the duty adjustment circuit 50 outputs the bias voltage to the first node N1, and at the same time, outputs the reference voltage VREF to the other of the one end and the other end of the variable capacitance element CV1. For example, in FIG. 3, the temperature compensation voltage VCMP is input to the one end of the variable capacitance element CV1, and the duty adjustment circuit 50 outputs the reference voltage VREF to the other end of the variable capacitance element CV1. It should be noted that it is possible to input the temperature compensation voltage VCMP to the other end of the variable capacitance element CV1, and it is possible for the duty adjustment circuit 50 to output the reference voltage VREF to the one end of the variable capacitance element CV1.

By adopting such a configuration, using the single duty adjustment circuit 50, it is possible to supply the bias voltage VBS to adjust the duty ratio of the clock signal CK, and at the same time, it becomes possible to supply the reference voltage VREF for the temperature compensation to realize the temperature compensation of the oscillation frequency. In other words, it becomes possible to supply the bias voltage VBS to adjust the duty ratio effectively using the duty adjustment circuit 50 for supplying the reference voltage VREF for the temperature compensation.

Thus, it becomes possible to realize commoditization of a circuit and reduction in scale of the circuit device 20, and to realize reduction in power consumption of the circuit device 20.

Specifically, as described in detail in FIG. 12 described later, the duty adjustment circuit 50 includes the voltage-dividing circuit 52 and the selection circuit 54, wherein the voltage-dividing circuit 52 has a plurality of resistors coupled in series to each other between the power supply node and the ground node, and outputs a plurality of divisional voltages obtained by the plurality of resistors dividing the voltage, and the selection circuit 54 selects one of the divisional voltages as the bias voltage VBS. In other words, the voltage-dividing circuit 52 is realized by the ladder resistance circuit, and the selection circuit 54 selects the bias voltage VBS from the plurality of divisional voltages generated by the voltage-dividing circuit 52 as the ladder resistance circuit based on the adjustment data ADJ thus input, and then supplies the result to the first node N1. According to such a configuration, by generating the plurality of divisional voltages between, for example, the power supply voltage VREG1 and the ground voltage GND with the voltage-dividing circuit 52, and then selecting a voltage corresponding to the adjustment data ADJ from the plurality of divisional voltages thus generated, it becomes possible to generate the bias voltage VBS to become the central voltage of the oscillation signal XI.

Further, in the present embodiment, the selection circuit 54 selects the first divisional voltage which is one of the divisional voltages from the voltage-dividing circuit 52 as the bias voltage VBS, and selects the second divisional voltage which is one of the divisional voltages as the reference voltage VREF. In this way, by supplying the first divisional voltage selected by the selection circuit 54 from the plurality of divisional voltages to the first node N1 as the bias voltage VBS, it becomes possible to adjust the duty ratio of the clock signal CK. Further, by supplying the second divisional voltage selected by the selection circuit 54 from the plurality of divisional voltages as the reference voltage VREF, it becomes possible to make the variable capacitance element CV1 operate in an appropriate sensitivity range to realize the temperature compensation of the oscillation frequency. Further, since it is sufficient to dispose a single ladder resistance circuit as the voltage-dividing circuit 52 in order to generate the bias voltage VBS and the reference voltage VREF, it becomes possible to realize reduction in size of the circuit area of the circuit device 20 compared to when disposing a first ladder resistance circuit for the bias voltage and a second ladder resistance circuit for the reference voltage. Further, since it becomes possible to reduce the electrical current flowing from the power supply node to the ground node to, for example, about half compared to when disposing the first ladder resistance circuit and the second ladder resistance circuit, it is possible to realize reduction in power consumption of the circuit device 20.

2. Modified Examples

The circuit device 20 according to the present embodiment is not limited to the configuration example described hereinabove, but can be put into practice with a variety of modifications. A variety of modified examples of the present embodiment will hereinafter be described.

Figure 9:
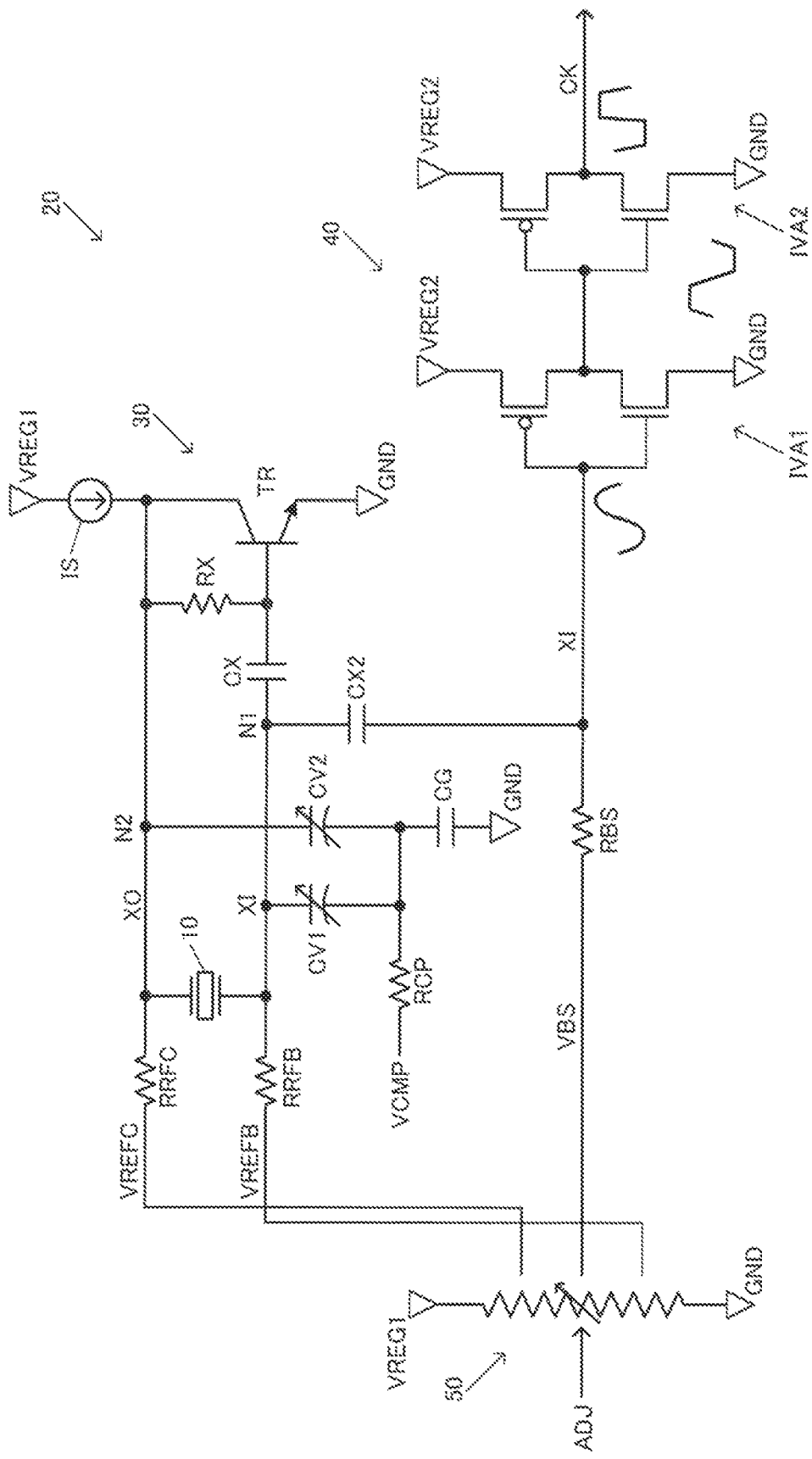
FIG. 9 is a diagram showing a modified example of the circuit device according to the embodiment.

For example, in the modified example shown in FIG. 9, the configuration and so on of the oscillation circuit 30 are different from those shown in FIG. 3. For example, in FIG. 9, the capacitors CF1, CF2 having the stationary capacitances shown in FIG. 3 are not disposed. Further, one end of the variable capacitance element CV1 is coupled to the first node N1, and the other end of the variable capacitance element CV1 is supplied with the temperature compensation voltage VCMP. Further, one end of the variable capacitance element CV2 is coupled to the second node N2, and the other end of the variable capacitance element CV2 is supplied with the temperature compensation voltage VCMP. Further, the first node N1 is supplied with a reference voltage VREFB from the duty adjustment circuit 50 via a resistance RRFB, and the second node N2 is supplied with a reference voltage VREFC from the duty adjustment circuit 50 via a resistance RRFC. Thus, a voltage corresponding to a voltage difference between the temperature compensation voltage VCMP and the reference voltage VREFB becomes to be applied to the both ends of the variable capacitance element CV1, and a voltage corresponding to the voltage difference between the temperature compensation voltage VCMP and the reference voltage VREFC becomes to be applied to the both ends of the variable capacitance element CV2. Further, the oscillation signal XI becomes an oscillation signal which varies centering on the reference voltage VREFB, and the oscillation signal XO becomes an oscillation signal which varies centering on the reference voltage VREFC. Further, in FIG. 9, a capacitor CX2 for cutting the DC component is disposed between the first node N1 and an input node of the waveform shaping circuit 40. By disposing such a capacitor CX2, only the AC component of the oscillation signal XI becomes to be transmitted toward the waveform shaping circuit 40 with the DC component thereof cut. Further, the bias voltage VBS forming the bias point is set by the duty adjustment circuit 50 with respect to the signal of the AC component of the oscillation signal XI, and it becomes possible to input the oscillation signal XI which varies centering on the bias voltage VBS to the waveform shaping circuit 40.

Figure 10:
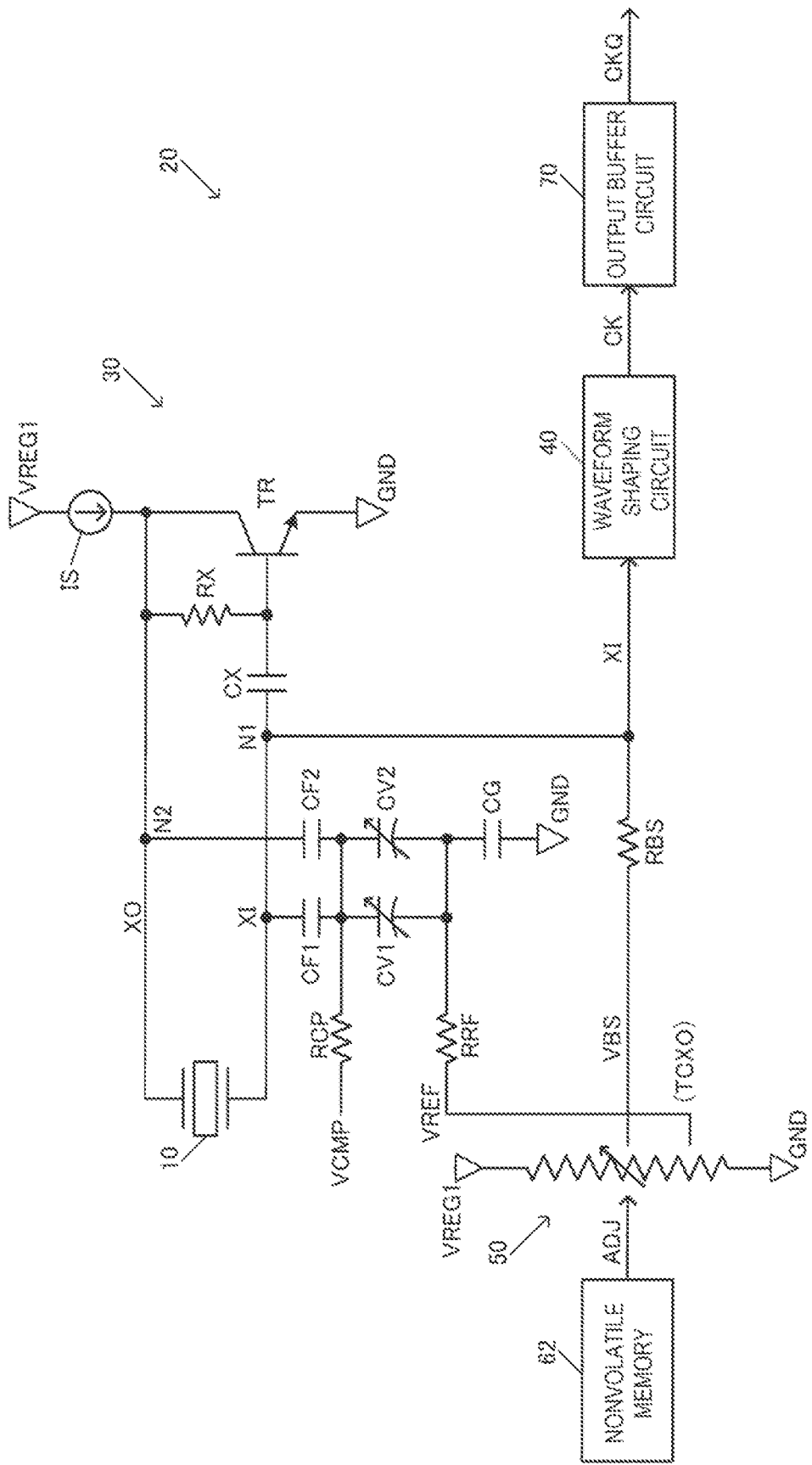
FIG. 10 is a diagram showing a modified example of the circuit device according to the embodiment.
Figure 11:
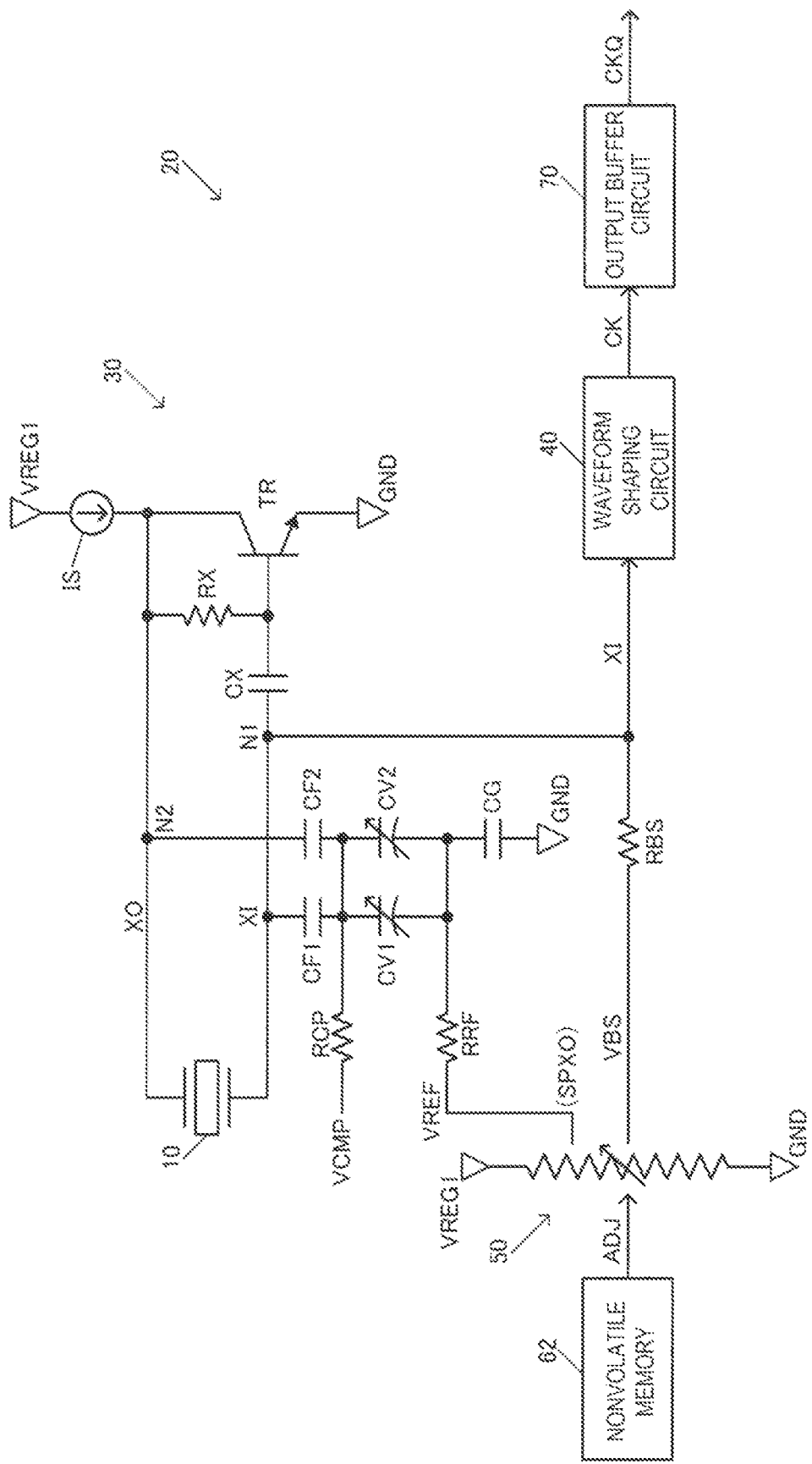
FIG. 11 is a diagram showing a modified example of the circuit device according to the embodiment.

In FIG. 10 and FIG. 11, the circuit device 20 includes the output buffer circuit 70 which buffers the clock signal CK and then outputs the output clock signal CKQ to the outside. The output buffer circuit 70 has a buffer circuit higher in drive capacity than, for example, the waveform shaping circuit 40, and the signal obtained by buffering the clock signal CK with the buffer circuit high in drive capacity is output to the outside of the circuit device 20 as the output clock signal CKQ. In this way, even when the external load is heavy, it becomes possible to supply the output clock signal CKQ having an appropriate drive waveform to the external load to drive the external load.

Further, in FIG. 10, denoting the temperature compensation voltage by VCMP and the reference voltage by VREF, the duty adjustment circuit 50 supplies the reference voltage VREF with which VCMP-VREF becomes higher than 0 V. The reference voltage VREF is supplied so that, for example, a voltage higher than 0 V is applied to the variable capacitance element CV1. Similarly, the reference voltage VREF is supplied so that a voltage higher than 0 V is applied to the variable capacitance element CV2.

In FIG. 10, the temperature compensation voltage VCMP becomes a voltage which varies in a third-order characteristic or the like in accordance with the temperature centering on, for example, 0.9 V. Further, the duty adjustment circuit 50 supplies the variable capacitance element CV1 with the reference voltage VREF of, for example, 0.3 V in FIG. 10 so that VCMP-VREF becomes higher than 0 V. Thus, the voltage VCMP-VREF higher than 0 V becomes to be applied to the variable capacitance element CV1. Therefore, the capacitance of the variable capacitance element CV1 becomes to variably change in accordance with the temperature compensation voltage VCMP within an appropriate sensitivity range. Similarly, the voltage VCMP-VREF higher than 0 V also becomes to be applied to the variable capacitance element CV2, and thus, the capacitance of the variable capacitance element CV2 becomes to variably change in accordance with the temperature compensation voltage VCMP within an appropriate sensitivity range. Thus, it becomes possible to use the circuit device 20 as a circuit device for the TCXO, and thus, it becomes possible to realize an oscillator as the TCXO.

In contrast, in FIG. 11, the duty adjustment circuit 50 supplies the reference voltage VREF with which VCMP-VREF becomes no higher than 0 V. The reference voltage VREF is supplied so that, for example, a voltage no higher than 0 V is applied to the variable capacitance element CV1. Similarly, the reference voltage VREF is supplied so that a voltage no higher than 0 V is applied to the variable capacitance element CV2. In FIG. 11, the temperature compensation voltage VCMP of, for example, about 0.6 V is supplied. Therefore, the duty adjustment circuit 50 supplies the variable capacitance element CV1 with the reference voltage VREF of, for example, 0.9 V in FIG. 11 so that VCMP-VREF becomes no higher than 0 V. Thus, the voltage VCMP-VREF no higher than 0 V becomes to be applied to the variable capacitance element CV1. Similarly, the voltage VCMP-VREF no higher than 0 V also becomes to be applied to the variable capacitance element CV2. Thus, it becomes possible to use the circuit device 20 as a circuit device for the SPXO, and thus, it becomes possible to realize an oscillator as the SPXO.

For example, the duty adjustment circuit 50 supplies a voltage of about 0.5 V±0.1 V as the bias voltage VBS. Therefore, in FIG. 10 in which the TCXO is realized, a voltage-dividing tap from which the reference voltage VREF is output in the ladder resistance circuit of the voltage-dividing circuit 52 becomes a tap at the ground node side of the voltage-dividing tap from which the bias voltage VBS is output. In contrast, in FIG. 11 in which the SPXO is realized, the voltage-dividing tap from which the reference voltage VREF is output in the ladder resistance circuit of the voltage-dividing circuit 52 becomes a tap at the VREG1 power supply node side of the voltage-dividing tap from which the bias voltage VBS is output. As described above, according to the present embodiment, only by switching the position of the voltage-dividing tap, from which the bias voltage VBS is output, in the ladder resistance circuit of the voltage-dividing circuit 52, it becomes possible to use the same circuit device 20 as the circuit device for the TCXO as shown in FIG. 10, or as the circuit device for the SPXO as shown in FIG. 11. Therefore, it becomes possible to use the circuit device 20 in common to the TCXO and the SPXO.

Figure 12:
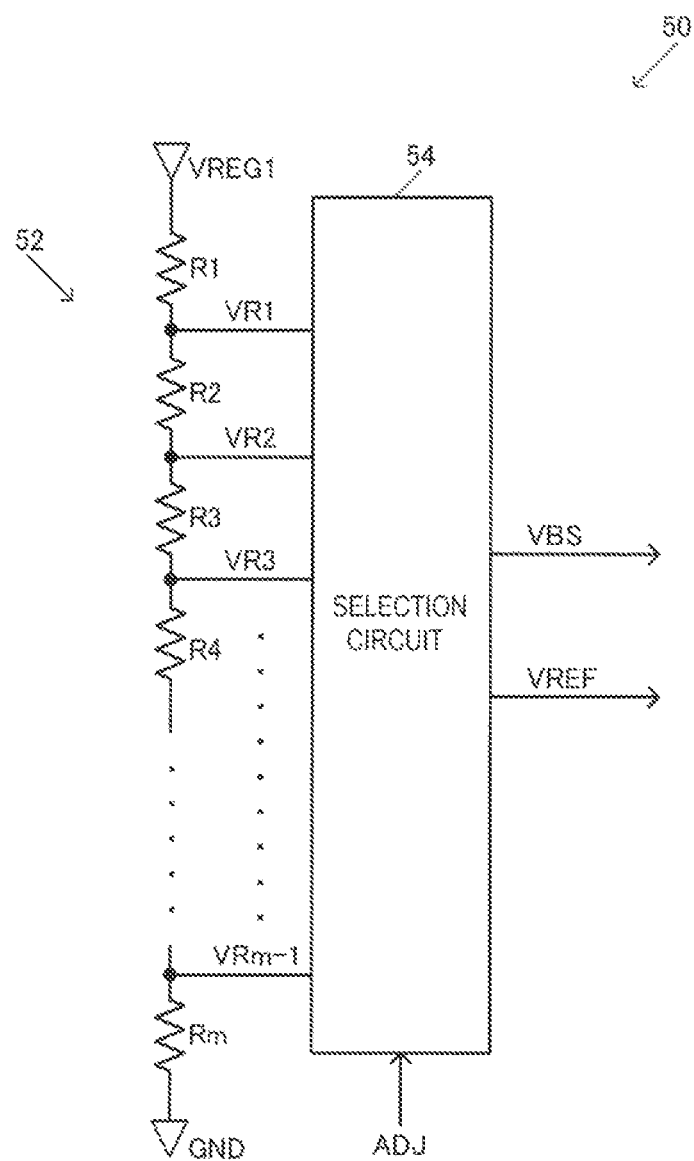
FIG. 12 is a diagram showing a configuration example of the duty adjustment circuit.

FIG. 12 shows a configuration example of the duty adjustment circuit 50. The duty adjustment circuit 50 includes the voltage-dividing circuit 52 and the selection circuit 54. The voltage-dividing circuit 52 has a plurality of resistors R1 through Rm coupled in series between the power supply node of the power supply voltage VREG1 and the ground node, and outputs a plurality of divisional voltages VR1 through VRm-1 divided in voltage by the plurality of resistors R1 through Rm. Further, the selection circuit 54 selects any one of the divisional voltages VR1 through VRm-1 as the bias voltage VBS based on the adjustment data ADJ. This selection circuit 54 can be realized by a plurality of selector circuits for performing the voltage selection using, for example, a tournament method. Specifically, the selection circuit 54 selects the first divisional voltage which is one of the divisional voltages VR1 through VRm-1 as the bias voltage VBS, selects the second divisional voltage which is one of the divisional voltages VR1 through VRm-1 as the reference voltage VREF, and outputs the selected voltages. Thus, it becomes possible to supply both of the bias voltage VBS for the duty adjustment and the reference voltage VREF for the temperature compensation using the single duty adjustment circuit 50, and thus, it becomes possible to achieve the commoditization of the circuit.

3. Oscillator

Figure 13:
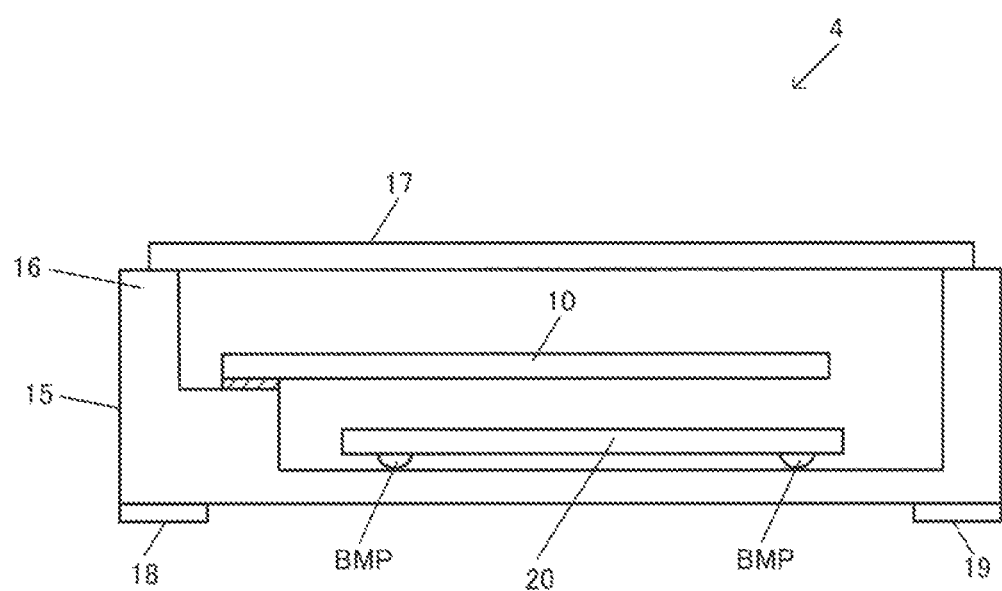
FIG. 13 is a diagram showing a structural example of an oscillator.

FIG. 13 shows a configuration example of the oscillator 4 according to the present embodiment. The oscillator 4 has the resonator 10, the circuit device 20, and a package 15 for housing the resonator 10 and the circuit device 20. The package 15 is formed of, for example, ceramics, and has a housing space inside, and houses the resonator 10 and the circuit device 20 in the housing space. The housing space is airtightly sealed, and is set to a reduced-pressure state, desirably a state approximate to a vacuum state. Due to the package 15, it is possible to protect the resonator 10 and the circuit device 20 from an impact, dust, heat, moisture, and so on in good condition.

The package 15 has a base 16 and a lid 17. Specifically, the package 15 is constituted by the base 16 for supporting the resonator 10 and the circuit device 20, and the lid 17 bonded to the upper surface of the base 16 so that the housing space is formed between the base 16 and the lid 17. Further, the resonator 10 is supported by a step part disposed inside the base 16 via terminal electrodes.

Further, the circuit device 20 is disposed on the inner bottom surface of the base 16. Specifically, the circuit device 20 is disposed so that an active surface faces to the inner bottom surface of the base 16. The active surface is a surface on which the circuit elements of the circuit device are formed. Further, bumps BMP are provided to the terminals of the circuit device 20. Further, the circuit device 20 is supported by the inner bottom surface of the base 16 via the bumps BMP having electrical conductivity. The bumps BMP having electrical conductivity are, for example, metal bumps, and the resonator 10 and the circuit device 20 are electrically coupled to each other via the bumps BMP, internal interconnections and the terminal electrodes of the package 15, and so on. Further, the circuit device 20 is electrically coupled to external terminals 18, 19 of the oscillator 4 via the bumps BMP and the internal interconnections of the package 15. The external terminals 18, 19 are formed on the outer bottom surface of the package 15. The external terminals 18, 19 are coupled to an external device via external wiring. The external wiring is, for example, interconnections provided to the circuit board on which the external device is mounted. Thus, it becomes possible to output the clock signal and so on to the external device.

It should be noted that although in FIG. 13, the circuit device 20 is flip-mounted so that the active surface of the circuit device 20 faces downward, the present embodiment is not limited to such a mounting arrangement. It is possible to mount the circuit device 20 so that, for example, the active surface of the circuit device 20 faces upward. In other words, the circuit device 20 is mounted so that the active surface is opposed to the resonator 10. Alternatively, the oscillator 4 can be an oscillator in a wafer-level package (WLP). In this case, the oscillator 4 includes a base having a semiconductor substrate, and through electrodes penetrating the semiconductor substrate between a first surface and a second surface thereof, the resonator 10 fixed to the first surface of the semiconductor substrate via an electrically conductive bonding members such as metal bumps, and external terminals disposed at the second surface side of the semiconductor substrate via an insulating layer such as a relocation wiring layer. Further, an integrated circuit forming the circuit device 20 is formed on the first surface or the second surface of the semiconductor substrate. In this case, a first semiconductor wafer provided with a plurality of bases on which the resonator 10 and the integrated circuit are disposed, and a second semiconductor wafer provided with a plurality of lids are bonded to each other to thereby bond the plurality of bases and the plurality of lids to each other, and then, segmentalization of the oscillators 4 is performed with a dicing saw or the like. In this way, it becomes possible to realize the oscillator 4 in the wafer-level package, and thus, it becomes possible to manufacture the oscillator 4 with high throughput and at low cost.

As described hereinabove, the circuit device according to the present embodiment includes an oscillation circuit which is electrically coupled to a first node to electrically be coupled to one end of a resonator and a second node to electrically be coupled to another end of the resonator, and is configured to oscillate the resonator to generate an oscillation signal, and a waveform shaping circuit which is coupled to the first node, to which the oscillation signal is input from the first node, and which is configured to output a clock signal obtained by performing waveform shaping on the oscillation signal. Further, the circuit device includes a duty adjustment circuit configured to supply the first node with a bias voltage which is variably adjusted based on adjustment data to thereby adjust a duty ratio of the clock signal.

In the present embodiment, the oscillation signal is generated by the oscillation circuit oscillating the resonator electrically coupled thereto via the first node and the second node, the oscillation signal at the first node is input to the waveform shaping circuit to be shaped in waveform, and thus, the clock signal becomes to be generated. On this occasion, the duty adjustment circuit supplies the first node with the bias voltage variably adjusted based on the adjustment data. Thus, the oscillation signal at the first node becomes the oscillation signal which varies centering on the bias voltage. Therefore, since it becomes possible to adjust the bias voltage of the oscillation signal based on the adjustment data so that the duty ratio of the clock signal becomes optimum to input the oscillation signal to the waveform shaping circuit, it becomes possible to adjust the duty ratio with high accuracy.

Further, in the present embodiment, there may further be included a nonvolatile memory configured to store the adjustment data, wherein the duty adjustment circuit may generate the bias voltage of a voltage set in accordance with the adjustment data stored in the nonvolatile memory.

In this way, by storing the adjustment data with which the optimum duty ratio can be adjusted to the nonvolatile memory, and then retrieving the adjustment data from the nonvolatile memory, it becomes possible to realize the high-accuracy duty adjustment.

Further, in the present embodiment, a power supply voltage of the oscillation circuit may be a voltage no lower than a power supply voltage of the waveform shaping circuit.

In this way, it is possible to make the amplitude of the oscillation signal input to the waveform shaping circuit as large as possible within the drive voltage of the waveform shaping circuit, and thus the waveform of the signal on which the waveform shaping has been performed can be made steep, and therefore, it becomes possible to reduce the variation in the duty ratio.

Further, in the present embodiment, the duty adjustment circuit may include a voltage-dividing circuit which has a plurality of resistors coupled in series between a power supply node and a ground node, and is configured to output a plurality of divisional voltages divided in voltage by the plurality of resistors, and a selection circuit configured to select any one of the divisional voltages as the bias voltage.

In this way, by generating the plurality of divisional voltages between the power supply voltage and the ground using the voltage-dividing circuit, and then selecting the voltage corresponding to the adjustment data out of the plurality of divisional voltages thus generated, it becomes possible to generate the bias voltage corresponding to the adjustment data.

Further, in the present embodiment, the oscillation circuit may include a stationary capacitance capacitor which is coupled to the first node in one end, and in which a capacitance value is fixed, and a variable capacitance element which is coupled to another end of the stationary capacitance capacitor in one end, and in which a capacitance value is variable, and a temperature compensation voltage may be input to one of the one end and another end of the variable capacitance element, and a reference voltage may be input to another of the one end and the another end of the variable capacitance element.

In this way, it becomes possible to vary the capacitance value of the variable capacitance element using the temperature compensation voltage based on the reference voltage to thereby realize the temperature compensation of the oscillation frequency of the oscillation circuit. Further, by disposing the stationary capacitance capacitor, it becomes possible to independently adjust the reference voltage and the bias voltage of each other to realize the temperature compensation and the duty adjustment of the oscillation signal.

Further, in the present embodiment, the duty adjustment circuit may output the bias voltage to the first node, and may output the reference voltage to the another of the one end and the another end of the variable capacitance element.

By adopting such a configuration, it is possible to supply the bias voltage to adjust the duty ratio of the clock signal using the single duty adjustment circuit, and at the same time, it becomes possible to supply the reference voltage for the temperature compensation to realize the temperature compensation of the oscillation frequency.

Further, in the present embodiment, the duty adjustment circuit may include a voltage-dividing circuit which has a plurality of resistors coupled in series between a power supply node and a ground node, and is configured to output a plurality of divisional voltages divided in voltage by the plurality of resistors, and a selection circuit configured to select a first divisional voltage which is one of the divisional voltages as the bias voltage, and select a second divisional voltage which is one of the divisional voltages as the reference voltage.

In this way, by supplying the first divisional voltage selected from the plurality of divisional voltages as the bias voltage, it becomes possible to adjust the duty ratio of the clock signal, and at the same time, by supplying the second divisional voltage selected from the plurality of divisional voltages as the reference voltage, it becomes possible to realize the temperature compensation of the oscillation frequency.

Further, in the present embodiment, denoting the temperature compensation voltage by VCMP and the reference voltage by VREF, the duty adjustment circuit may supply the reference voltage with which VCMP-VREF becomes higher than 0 V.

In this way, since the voltage VCMP-VREF higher than 0 V is applied to the variable capacitance element, and the capacitance of the variable capacitance element becomes to vary in accordance with the temperature compensation voltage, it becomes possible to realize the oscillator and so on having the temperature compensation function.

Further, in the present embodiment, denoting the temperature compensation voltage by VCMP and the reference voltage by VREF, the duty adjustment circuit may supply the reference voltage with which VCMP-VREF becomes no higher than 0 V.

In this way, the voltage VCMP-VREF no higher than 0 V becomes to be applied to the variable capacitance element, and it becomes possible to realize the oscillator and so on which do not have the temperature compensation function.

Further, in the present embodiment, there may further be included an output buffer circuit configured to buffer the clock signal, and then output an output clock signal to an outside.

In this way, even when the external load is heavy, it becomes possible to supply the output clock signal having an appropriate drive waveform to the external load to drive the external load.

Further, the present embodiment relates to an oscillator including the circuit device described above and a resonator.

It should be noted that although the present embodiment is hereinabove described in detail, it should easily be understood by those skilled in the art that it is possible to make a variety of modifications not substantially departing from the novel matters and the advantages of the present disclosure. Therefore, all of such modified examples should be included in the scope of the present disclosure. For example, a term described at least once with a different term having a broader sense or the same meaning in the specification or the accompanying drawings can be replaced with that different term in any part of the specification or the accompanying drawings. Further, all of the combinations of the present embodiment and the modified examples are also included in the scope of the present disclosure. Further, the configurations and the operations of the circuit device and the oscillator are not limited to those described in the present embodiment, but can be implemented with a variety of modifications.

What is claimed is:
1. A circuit device comprising:
an oscillation circuit which is electrically coupled to a first node to electrically be coupled to one end of a resonator and a second node to electrically be coupled to another end of the resonator, the oscillation circuit being con- figured to oscillate the resonator to generate an oscillation signal, the oscillation circuit including:
an oscillation capacitor having one end coupled to the first node;
an oscillation resistor having:
one end coupled to another end of the oscillation capacitor; and
another end coupled to the second node;
a stationary capacitance capacitor having one end coupled to the first node, a capacitance value of the stationary capacitance capacitor being fixed; and
a variable capacitance element having one end coupled to another end of the stationary capacitance capacitor, a capacitance value of the variable capacitance element being variable;
a waveform shaping circuit which is coupled to the first node, to which the oscillation signal is input from the first node, and which is configured to output a clock signal obtained by performing waveform shaping on the oscillation signal; and
a duty adjustment circuit configured to:
supply the first node with a bias voltage which is variably adjusted based on adjustment data to thereby adjust a duty ratio of the clock signal; and
supply a reference voltage to the other end of the variable capacitance element.

2. The circuit device according to claim 1 further comprising:
a nonvolatile memory configured to store the adjustment data, wherein
the duty adjustment circuit generates the bias voltage of a voltage set in accordance with the adjustment data stored in the nonvolatile memory.

3. The circuit device according to claim 1, wherein
a power supply voltage of the oscillation circuit is a voltage no lower than a power supply voltage of the waveform shaping circuit.

4. The circuit device according to claim 1, wherein
the duty adjustment circuit includes
a voltage-dividing circuit which has a plurality of resistors coupled in series between a power supply node and a ground node, and is configured to output a plurality of divisional voltages divided in voltage by the plurality of resistors, and
a selection circuit configured to select any one of the divisional voltages as the bias voltage.

5. The circuit device according to claim 1, wherein
a temperature compensation voltage is input to the one end of the variable capacitance element.

6. The circuit device according to claim 5, wherein
the duty adjustment circuit includes
a voltage-dividing circuit which has a plurality of resistors coupled in series between a power supply node and a ground node, and is configured to output a plurality of divisional voltages divided in voltage by the plurality of resistors, and
a selection circuit configured to select a first divisional voltage which is one of the divisional voltages as the bias voltage, and select a second divisional voltage which is one of the divisional voltages as the reference voltage.

7. The circuit device according to claim 5, wherein
denoting the temperature compensation voltage by VCMP and the reference voltage by VREF, the duty adjustment circuit supplies the reference voltage with which VCMP-VREF becomes higher than 0 V.

8. The circuit device according to claim 5, wherein
denoting the temperature compensation voltage by VCMP and the reference voltage by VREF, the duty adjustment circuit supplies the reference voltage with which VCMP-VREF becomes no higher than 0 V.

9. The circuit device according to claim 1 further comprising:
an output buffer circuit configured to buffer the clock signal, and then output an output clock signal to an outside.

10. An oscillator comprising:
the circuit device according to claim 1; and
the resonator.

11. The circuit device according to claim 1, wherein
the bias voltage is higher than the reference voltage.

* * * * *